United States Patent
Citla et al.

(10) Patent No.: US 11,581,183 B2
(45) Date of Patent: Feb. 14, 2023

(54) METHODS OF FORMING AMORPHOUS CARBON HARD MASK LAYERS AND HARD MASK LAYERS FORMED THEREFROM

(71) Applicant: Applied Materials, Inc., Santa Clara, CA (US)

(72) Inventors: Bhargav S. Citla, Fremont, CA (US); Mei-Yee Shek, Palo Alto, CA (US); Srinivas D. Nemani, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 181 days.

(21) Appl. No.: 17/192,882

(22) Filed: Mar. 4, 2021

(65) Prior Publication Data
US 2021/0193461 A1 Jun. 24, 2021

Related U.S. Application Data

(62) Division of application No. 16/396,167, filed on Apr. 26, 2019, now Pat. No. 10,950,429.
(Continued)

(51) Int. Cl.
*H01L 21/02* (2006.01)
*C23C 14/02* (2006.01)
(Continued)

(52) U.S. Cl.
CPC ........ *H01L 21/02266* (2013.01); *C23C 14/02* (2013.01); *C23C 14/0605* (2013.01);
(Continued)

(58) Field of Classification Search
CPC ......... H01L 21/02115; H01L 21/02266; H01L 21/02318
See application file for complete search history.

(56) References Cited

U.S. PATENT DOCUMENTS 3,684,592 A 8/1972 Chang et al.
3,749,383 A 7/1973 Voigt et al.
(Continued)

FOREIGN PATENT DOCUMENTS

CN 1280875 C 10/2006
CN 101871043 A 10/2010
(Continued)

OTHER PUBLICATIONS

Korean Office Action dated Jul. 16, 2021 for Application No. 10-2020-7007956.
(Continued)

*Primary Examiner* — John A Bodnar
(74) *Attorney, Agent, or Firm* — Patterson + Sheridan, LLP

(57) ABSTRACT

Embodiments described herein provide for post deposition anneal of a substrate, having an amorphous carbon layer deposited thereon, to desirably reduce variations in local stresses thereacross. In one embodiment, a method of processing a substrate includes positioning a substrate, having an amorphous carbon layer deposited thereon, in a first processing volume, flowing an anneal gas into the first processing volume, heating the substrate to an anneal temperature of not more than about 450° C., and maintaining the substrate at the anneal temperature for about 30 seconds or more. Herein, the amorphous carbon layer was deposited on the substrate using a method which included positioning the substrate on a substrate support disposed in a second processing volume, flowing a processing gas into the second processing volume, applying pulsed DC power to a carbon target disposed in the second processing volume, forming a plasma of the processing gas, and depositing the amorphous carbon layer on the substrate.

18 Claims, 7 Drawing Sheets

Related U.S. Application Data

(60) Provisional application No. 62/668,558, filed on May 8, 2018.

(51) Int. Cl.
  *C23C 14/06* (2006.01)
  *H01L 21/033* (2006.01)
  *C23C 14/35* (2006.01)

(52) U.S. Cl.
  CPC ........ *C23C 14/35* (2013.01); *H01L 21/02115* (2013.01); *H01L 21/02356* (2013.01); *H01L 21/0332* (2013.01)

(56) References Cited

U.S. PATENT DOCUMENTS

| | | | |
|---|---|---|---|
| 3,758,316 A | 9/1973 | Sowards et al. |
| 4,409,260 A | 10/1983 | Pastor et al. |
| 4,424,101 A | 1/1984 | Nowicki |
| 4,524,587 A | 6/1985 | Kantor |
| 4,576,652 A | 3/1986 | Hovel et al. |
| 4,589,193 A | 5/1986 | Goth et al. |
| 4,879,259 A | 11/1989 | Reynolds et al. |
| 5,050,540 A | 9/1991 | Lindberg |
| 5,114,513 A | 5/1992 | Hosokawa et al. |
| 5,126,117 A | 6/1992 | Schumacher et al. |
| 5,149,378 A | 9/1992 | Ohmi et al. |
| 5,167,717 A | 12/1992 | Boitnott |
| 5,175,123 A | 12/1992 | Vasquez et al. |
| 5,300,320 A | 4/1994 | Barron et al. |
| 5,314,541 A | 5/1994 | Saito et al. |
| 5,319,212 A | 6/1994 | Tokoro |
| 5,366,905 A | 11/1994 | Mukai |
| 5,472,812 A | 12/1995 | Sekine |
| 5,578,132 A | 11/1996 | Yamaga et al. |
| 5,590,695 A | 1/1997 | Siegele et al. |
| 5,597,439 A | 1/1997 | Salzman |
| 5,620,524 A | 4/1997 | Fan et al. |
| 5,677,230 A | 10/1997 | Weitzel et al. |
| 5,747,383 A | 5/1998 | Chen et al. |
| 5,808,245 A | 9/1998 | Wiese et al. |
| 5,857,368 A | 1/1999 | Grunes et al. |
| 5,858,051 A | 1/1999 | Komiyama et al. |
| 5,877,087 A | 3/1999 | Mosely et al. |
| 5,879,756 A | 3/1999 | Fathi et al. |
| 5,880,041 A | 3/1999 | Ong |
| 5,886,864 A | 3/1999 | Dvorsky |
| 5,888,888 A | 3/1999 | Talwar et al. |
| 5,918,149 A | 6/1999 | Besser et al. |
| 5,940,985 A | 8/1999 | Kamikawa et al. |
| 6,071,810 A | 6/2000 | Wada et al. |
| 6,077,571 A | 6/2000 | Kaloyeros |
| 6,082,950 A | 7/2000 | Altwood et al. |
| 6,086,730 A | 7/2000 | Liu |
| 6,103,585 A | 8/2000 | Michaelis |
| 6,136,664 A | 10/2000 | Economikos et al. |
| 6,140,235 A | 10/2000 | Yao et al. |
| 6,150,286 A | 11/2000 | Sun et al. |
| 6,164,412 A | 12/2000 | Allman |
| 6,207,487 B1 | 3/2001 | Kim et al. |
| 6,242,368 B1 | 6/2001 | Holmer et al. |
| 6,242,808 B1 | 6/2001 | Shimizu et al. |
| 6,251,242 B1 | 6/2001 | Fu et al. |
| 6,251,751 B1 | 6/2001 | Chu et al. |
| 6,277,249 B1 | 8/2001 | Gopalraja et al. |
| 6,284,646 B1 | 9/2001 | Leem |
| 6,299,753 B1 | 10/2001 | Chao et al. |
| 6,305,314 B1 | 10/2001 | Sneh et al. |
| 6,319,766 B1 | 11/2001 | Bakli et al. |
| 6,319,847 B1 | 11/2001 | Ishikawa |
| 6,334,249 B2 | 1/2002 | Hsu |
| 6,334,266 B1 | 1/2002 | Moritz et al. |
| 6,335,240 B1 | 1/2002 | Kim et al. |
| 6,344,249 B1 | 2/2002 | Maruyama et al. |
| 6,344,419 B1 | 2/2002 | Forster et al. |
| 6,348,376 B2 | 2/2002 | Lim et al. |
| 6,355,558 B1 | 3/2002 | Dixit |
| 6,358,829 B2 | 3/2002 | Yoon et al. |
| 6,368,412 B1 | 4/2002 | Gomi |
| 6,372,598 B2 | 4/2002 | Kang et al. |
| 6,387,764 B1 | 5/2002 | Curtis et al. |
| 6,399,486 B1 | 6/2002 | Chen et al. |
| 6,399,491 B2 | 6/2002 | Jeon et al. |
| 6,416,822 B1 | 7/2002 | Chiang et al. |
| 6,428,859 B1 | 8/2002 | Chiang et al. |
| 6,442,980 B2 | 9/2002 | Preston et al. |
| 6,451,119 B2 | 9/2002 | Sneh et al. |
| 6,451,695 B2 | 9/2002 | Sneh |
| 6,458,701 B1 | 10/2002 | Chae et al. |
| 6,464,779 B1 | 10/2002 | Powell et al. |
| 6,468,490 B1 | 10/2002 | Shamouilian et al. |
| 6,468,924 B2 | 10/2002 | Lee et al. |
| 6,475,910 B1 | 11/2002 | Sneh |
| 6,478,872 B1 | 11/2002 | Chae et al. |
| 6,482,262 B1 | 11/2002 | Elers et al. |
| 6,482,733 B2 | 11/2002 | Raaijmakers et al. |
| 6,482,740 B2 | 11/2002 | Soininen et al. |
| 6,489,214 B2 | 12/2002 | Kim et al. |
| 6,500,603 B1 | 12/2002 | Shioda |
| 6,511,539 B1 | 1/2003 | Raaijmakers |
| 6,534,395 B2 | 3/2003 | Werkhoven et al. |
| 6,548,424 B2 | 4/2003 | Putkonen |
| 6,551,929 B1 | 4/2003 | Kori et al. |
| 6,569,501 B2 | 5/2003 | Chiang et al. |
| 6,583,497 B2 | 6/2003 | Xia et al. |
| 6,585,823 B1 | 7/2003 | Van Wijck |
| 6,599,572 B2 | 7/2003 | Saanila et al. |
| 6,599,819 B1 | 7/2003 | Goto |
| 6,607,976 B2 | 8/2003 | Chen et al. |
| 6,619,304 B2 | 9/2003 | Worm |
| 6,620,670 B2 | 9/2003 | Song et al. |
| 6,620,723 B1 | 9/2003 | Byun et al. |
| 6,620,956 B2 | 9/2003 | Chen et al. |
| 6,630,201 B2 | 10/2003 | Chiang et al. |
| 6,632,279 B1 | 10/2003 | Ritala et al. |
| 6,657,304 B1 | 12/2003 | Woo et al. |
| 6,660,660 B2 | 12/2003 | Haukka et al. |
| 6,686,271 B2 | 2/2004 | Raaijmakers et al. |
| 6,780,777 B2 | 8/2004 | Yun et al. |
| 6,797,336 B2 | 9/2004 | Garvey et al. |
| 6,825,115 B1 | 11/2004 | Xiang et al. |
| 6,841,432 B1 | 1/2005 | Takemura et al. |
| 6,849,122 B1 | 2/2005 | Fair |
| 6,867,130 B1 | 3/2005 | Karlsson et al. |
| 6,867,152 B1 | 3/2005 | Hausmann et al. |
| 6,889,627 B1 | 5/2005 | Hao |
| 6,897,118 B1 | 5/2005 | Poon et al. |
| 6,969,448 B1 | 11/2005 | Lau |
| 7,055,333 B2 | 6/2006 | Leitch et al. |
| 7,084,079 B2 | 8/2006 | Conti et al. |
| 7,105,061 B1 | 9/2006 | Shrinivasan et al. |
| 7,111,630 B2 | 9/2006 | Mizobata et al. |
| 7,114,517 B2 | 10/2006 | Sund et al. |
| 7,211,525 B1 | 5/2007 | Shanker et al. |
| 7,282,458 B2 | 10/2007 | Gates et al. |
| 7,361,231 B2 | 4/2008 | Fury et al. |
| 7,429,402 B2 | 9/2008 | Gandikota et al. |
| 7,432,200 B2 | 10/2008 | Chowdhury et al. |
| 7,460,760 B2 | 12/2008 | Cho et al. |
| 7,465,650 B2 | 12/2008 | Derderian |
| 7,491,658 B2 | 2/2009 | Nguyen et al. |
| 7,503,334 B1 | 3/2009 | Shrinivasan et al. |
| 7,521,089 B2 | 4/2009 | Hillman et al. |
| 7,521,378 B2 | 4/2009 | Fucsko et al. |
| 7,541,297 B2 | 6/2009 | Mallick et al. |
| 7,576,441 B2 | 8/2009 | Yin et al. |
| 7,629,227 B1 | 12/2009 | Wang et al. |
| 7,650,965 B2 | 1/2010 | Thayer et al. |
| 7,651,959 B2 | 1/2010 | Fukazawa et al. |
| 7,655,532 B1 | 2/2010 | Chen et al. |
| 7,691,442 B2 | 4/2010 | Gandikota et al. |
| 7,709,320 B2 | 5/2010 | Cheng |
| 7,759,749 B2 | 7/2010 | Tanikawa |
| 7,825,038 B2 | 11/2010 | Ingle et al. |

(56) References Cited

U.S. PATENT DOCUMENTS

| | | |
|---|---|---|
| 7,825,042 B2 | 11/2010 | Mandal |
| 7,867,914 B2 | 1/2011 | Xi et al. |
| 7,867,923 B2 | 1/2011 | Mallick et al. |
| 7,891,228 B2 | 2/2011 | Ding et al. |
| 7,910,165 B2 | 3/2011 | Ganguli et al. |
| 7,964,505 B2 | 6/2011 | Khandelwal et al. |
| 7,964,506 B1 | 6/2011 | Ponnuswamy et al. |
| 8,027,089 B2 | 9/2011 | Hayashi |
| 8,278,224 B1 | 10/2012 | Mui et al. |
| 8,306,026 B2 | 11/2012 | Anjum et al. |
| 8,318,584 B2 | 11/2012 | Li et al. |
| 8,349,085 B2 | 1/2013 | Tahara et al. |
| 8,449,942 B2 | 5/2013 | Liang et al. |
| 8,455,368 B2 | 6/2013 | Chandler et al. |
| 8,466,073 B2 | 6/2013 | Wang et al. |
| 8,481,123 B2 | 7/2013 | Kim et al. |
| 8,536,065 B2 | 9/2013 | Seamons et al. |
| 8,557,712 B1 | 10/2013 | Antonelli et al. |
| 8,563,445 B2 | 10/2013 | Liang et al. |
| 8,585,873 B2 | 11/2013 | Ford et al. |
| 8,647,992 B2 | 2/2014 | Liang et al. |
| 8,648,253 B1 | 2/2014 | Woods et al. |
| 8,668,868 B2 | 3/2014 | Chiu et al. |
| 8,741,788 B2 | 6/2014 | Liang et al. |
| 8,871,656 B2 | 10/2014 | Mallick et al. |
| 8,906,761 B2 | 12/2014 | Kim et al. |
| 8,936,834 B2 | 1/2015 | Kim et al. |
| 9,121,515 B2 | 9/2015 | Yamamoto et al. |
| 9,153,442 B2 | 10/2015 | Wang et al. |
| 9,157,730 B2 | 10/2015 | Rajagopalan et al. |
| 9,190,321 B2 | 11/2015 | Cabral, Jr. et al. |
| 9,257,314 B1 | 2/2016 | Rivera et al. |
| 9,306,026 B2 | 4/2016 | Toriumi et al. |
| 9,330,939 B2 | 5/2016 | Zope et al. |
| 9,362,107 B2 | 6/2016 | Thadani et al. |
| 9,382,621 B2 | 7/2016 | Choi et al. |
| 9,423,313 B2 | 8/2016 | Douba et al. |
| 9,484,406 B1 | 11/2016 | Sun et al. |
| 9,502,307 B1 | 11/2016 | Bao et al. |
| 9,570,551 B1 | 2/2017 | Balakrishnan et al. |
| 9,583,655 B2 | 2/2017 | Cheng |
| 9,646,850 B2 | 5/2017 | Pethe |
| 9,679,810 B1 | 6/2017 | Nag et al. |
| 9,685,371 B2 | 6/2017 | Zope et al. |
| 9,695,503 B2 | 7/2017 | Stowell et al. |
| 9,741,626 B1 | 8/2017 | Cheng et al. |
| 9,777,378 B2 | 10/2017 | Nemani et al. |
| 10,049,927 B2 | 8/2018 | Mebarki et al. |
| 10,083,834 B2 | 9/2018 | Thompson et al. |
| 10,096,516 B1 | 10/2018 | Leschkies et al. |
| 10,179,941 B1 | 1/2019 | Khan et al. |
| 10,224,224 B2 | 3/2019 | Liang et al. |
| 10,234,630 B2 | 3/2019 | Meyer Timmerman Thijssen et al. |
| 10,269,571 B2 | 4/2019 | Wong et al. |
| 10,276,411 B2 | 4/2019 | Delmas et al. |
| 10,403,729 B2 | 9/2019 | Lee |
| 10,410,918 B2 | 9/2019 | Wu et al. |
| 10,529,585 B2 | 1/2020 | Manna et al. |
| 10,529,603 B2 | 1/2020 | Liang et al. |
| 10,566,188 B2 | 2/2020 | Clemons et al. |
| 10,622,214 B2 | 4/2020 | Wong et al. |
| 10,636,669 B2 | 4/2020 | Chen et al. |
| 10,636,677 B2 | 4/2020 | Delmas et al. |
| 10,636,704 B2 | 4/2020 | Mebarki et al. |
| 10,643,867 B2 | 5/2020 | Delmas et al. |
| 10,675,581 B2 | 6/2020 | Khan et al. |
| 10,685,830 B2 | 6/2020 | Delmas |
| 10,714,331 B2 | 7/2020 | Balseanu et al. |
| 10,720,341 B2 | 7/2020 | Liang et al. |
| 10,748,783 B2 | 8/2020 | Khan et al. |
| 10,790,183 B2 | 9/2020 | Sun et al. |
| 10,847,360 B2 | 11/2020 | Wong et al. |
| 10,854,483 B2 | 12/2020 | Schaller et al. |
| 10,916,433 B2 | 2/2021 | Ren et al. |
| 10,950,429 B2 | 3/2021 | Citla et al. |
| 10,957,533 B2 | 3/2021 | Jiang et al. |
| 11,018,032 B2 | 5/2021 | Delmas et al. |
| 11,101,174 B2 | 8/2021 | Jiang et al. |
| 2001/0016429 A1 | 8/2001 | Mak et al. |
| 2001/0029108 A1 | 10/2001 | Tometsuka |
| 2001/0041122 A1 | 11/2001 | Kroeker |
| 2001/0050096 A1 | 12/2001 | Costantini et al. |
| 2001/0055649 A1 | 12/2001 | Ogure et al. |
| 2002/0066535 A1 | 6/2002 | Brown et al. |
| 2002/0073922 A1 | 6/2002 | Frankel et al. |
| 2002/0098715 A1 | 7/2002 | Lane et al. |
| 2002/0122885 A1 | 9/2002 | Ahn |
| 2002/0134439 A1 | 9/2002 | Kawasaki et al. |
| 2002/0148492 A1 | 10/2002 | Yamagata et al. |
| 2002/0151128 A1 | 10/2002 | Lane et al. |
| 2002/0155714 A1 | 10/2002 | Suzuki |
| 2002/0192056 A1 | 12/2002 | Reimer et al. |
| 2002/0197806 A1 | 12/2002 | Furukawa et al. |
| 2003/0022487 A1 | 1/2003 | Yoon et al. |
| 2003/0030945 A1 | 2/2003 | Heinonen et al. |
| 2003/0049372 A1 | 3/2003 | Cook et al. |
| 2003/0053893 A1 | 3/2003 | Matsunaga et al. |
| 2003/0059538 A1 | 3/2003 | Chung et al. |
| 2003/0101938 A1 | 6/2003 | Ronsse et al. |
| 2003/0121887 A1 | 7/2003 | Garvey et al. |
| 2003/0129832 A1 | 7/2003 | Fujikawa |
| 2003/0148035 A1 | 8/2003 | Lingampalli |
| 2003/0148631 A1 | 8/2003 | Kuo et al. |
| 2003/0194615 A1 | 10/2003 | Krauth |
| 2003/0207593 A1 | 11/2003 | Derderian et al. |
| 2003/0232512 A1 | 12/2003 | Dickinson et al. |
| 2004/0025908 A1 | 2/2004 | Douglas et al. |
| 2004/0060519 A1 | 4/2004 | Beauchaine et al. |
| 2004/0074869 A1 | 4/2004 | Wang et al. |
| 2004/0097060 A1 | 5/2004 | San et al. |
| 2004/0112409 A1 | 6/2004 | Schilling |
| 2004/0180510 A1 | 9/2004 | Ranade |
| 2004/0184792 A1 | 9/2004 | Hamelin et al. |
| 2004/0219800 A1 | 11/2004 | Tognetti |
| 2004/0248392 A1 | 12/2004 | Narwankar et al. |
| 2004/0255979 A1 | 12/2004 | Fury et al. |
| 2005/0003655 A1 | 1/2005 | Cathey et al. |
| 2005/0014365 A1 | 1/2005 | Moon et al. |
| 2005/0022737 A1 | 2/2005 | Shimizu et al. |
| 2005/0051194 A1 | 3/2005 | Sakashita et al. |
| 2005/0074956 A1 | 4/2005 | Autryve et al. |
| 2005/0082281 A1 | 4/2005 | Uemori et al. |
| 2005/0109392 A1 | 5/2005 | Hollars |
| 2005/0136684 A1 | 6/2005 | Mukai et al. |
| 2005/0161158 A1 | 7/2005 | Schumacher |
| 2005/0164445 A1 | 7/2005 | Lin et al. |
| 2005/0186765 A1 | 8/2005 | Ma et al. |
| 2005/0191828 A1 | 9/2005 | Al-Bayati et al. |
| 2005/0198971 A1 | 9/2005 | Leitch et al. |
| 2005/0205210 A1 | 9/2005 | Devine et al. |
| 2005/0227479 A1 | 10/2005 | Feng et al. |
| 2005/0250347 A1 | 11/2005 | Bailey et al. |
| 2005/0269291 A1 | 12/2005 | Kent |
| 2006/0003596 A1 | 1/2006 | Fucsko et al. |
| 2006/0035035 A1 | 2/2006 | Sakama |
| 2006/0079086 A1 | 4/2006 | Boit et al. |
| 2006/0091493 A1 | 5/2006 | Wu |
| 2006/0105107 A1 | 5/2006 | Lindeboom et al. |
| 2006/0105515 A1 | 5/2006 | Amos et al. |
| 2006/0105557 A1 | 5/2006 | Klee et al. |
| 2006/0110934 A1 | 5/2006 | Fukuchi |
| 2006/0124613 A1 | 6/2006 | Kumar et al. |
| 2006/0128150 A1 | 6/2006 | Gandikota et al. |
| 2006/0175012 A1 | 8/2006 | Lee |
| 2006/0207633 A1 | 9/2006 | Kim et al. |
| 2006/0226117 A1 | 10/2006 | Bertram et al. |
| 2006/0240187 A1 | 10/2006 | Weidman |
| 2006/0279025 A1 | 12/2006 | Heidari et al. |
| 2006/0290017 A1 | 12/2006 | Yanagisawa |
| 2007/0012402 A1 | 1/2007 | Sneh |
| 2007/0045753 A1 | 3/2007 | Pae et al. |
| 2007/0087533 A1 | 4/2007 | Nishikawa et al. |
| 2007/0095651 A1 | 5/2007 | Ye et al. |

(56) References Cited

U.S. PATENT DOCUMENTS

| | | |
|---|---|---|
| 2007/0111519 A1 | 5/2007 | Lubomirsky et al. |
| 2007/0116873 A1 | 5/2007 | Li et al. |
| 2007/0145416 A1 | 6/2007 | Ohta |
| 2007/0187386 A1 | 8/2007 | Kim et al. |
| 2007/0204797 A1 | 9/2007 | Fischer |
| 2007/0209931 A1 | 9/2007 | Miller |
| 2007/0212850 A1 | 9/2007 | Ingle et al. |
| 2007/0243317 A1 | 10/2007 | Du Bois et al. |
| 2007/0254471 A1 | 11/2007 | Kameyama et al. |
| 2007/0254477 A1 | 11/2007 | Muraoka et al. |
| 2007/0256559 A1 | 11/2007 | Chen et al. |
| 2008/0001196 A1 | 1/2008 | Cheng |
| 2008/0073691 A1 | 3/2008 | Konno et al. |
| 2008/0074658 A1 | 3/2008 | Davis et al. |
| 2008/0076230 A1 | 3/2008 | Cheng |
| 2008/0083109 A1 | 4/2008 | Shibata et al. |
| 2008/0085611 A1 | 4/2008 | Khandelwal et al. |
| 2008/0115726 A1 | 5/2008 | Ingle et al. |
| 2008/0121882 A1 | 5/2008 | Hwang et al. |
| 2008/0132050 A1 | 6/2008 | Lavoie |
| 2008/0210273 A1 | 9/2008 | Joe |
| 2008/0241384 A1 | 10/2008 | Jeong et al. |
| 2008/0251904 A1 | 10/2008 | Theuss et al. |
| 2008/0268635 A1 | 10/2008 | Yu et al. |
| 2008/0311711 A1 | 12/2008 | Hampp et al. |
| 2008/0315762 A1 | 12/2008 | Hamada et al. |
| 2009/0018688 A1 | 1/2009 | Chandler et al. |
| 2009/0029126 A1 | 1/2009 | Tanikawa |
| 2009/0035915 A1 | 2/2009 | Su |
| 2009/0035952 A1 | 2/2009 | Chua et al. |
| 2009/0053426 A1 | 2/2009 | Lu et al. |
| 2009/0053893 A1 | 2/2009 | Khandelwal et al. |
| 2009/0081884 A1 | 3/2009 | Yokota et al. |
| 2009/0087981 A1 | 4/2009 | Suzuki et al. |
| 2009/0110622 A1 | 4/2009 | Chiu et al. |
| 2009/0148965 A1 | 6/2009 | Kim et al. |
| 2009/0180847 A1 | 7/2009 | Guo et al. |
| 2009/0183992 A1 | 7/2009 | Fredenberg et al. |
| 2009/0186481 A1 | 7/2009 | Suzuki et al. |
| 2009/0233449 A1 | 9/2009 | Lebouitz et al. |
| 2009/0243126 A1 | 10/2009 | Washiya et al. |
| 2009/0246952 A1 | 10/2009 | Ishizaka et al. |
| 2009/0269507 A1 | 10/2009 | Yu et al. |
| 2009/0283735 A1 | 11/2009 | Li et al. |
| 2009/0298257 A1 | 12/2009 | Lee et al. |
| 2010/0006211 A1 | 1/2010 | Wolk et al. |
| 2010/0012292 A1 | 1/2010 | Yamazaki |
| 2010/0022068 A1 | 1/2010 | Chen et al. |
| 2010/0032838 A1 | 2/2010 | Kikuchi et al. |
| 2010/0072569 A1 | 3/2010 | Han et al. |
| 2010/0102417 A1 | 4/2010 | Ganguli et al. |
| 2010/0173470 A1 | 7/2010 | Lee et al. |
| 2010/0173495 A1 | 7/2010 | Thakur et al. |
| 2010/0196626 A1 | 8/2010 | Choi et al. |
| 2010/0203725 A1 | 8/2010 | Choi et al. |
| 2010/0248419 A1 | 9/2010 | Woodruff et al. |
| 2010/0273324 A1 | 10/2010 | Lin et al. |
| 2010/0297854 A1 | 11/2010 | Ramamurthy et al. |
| 2010/0304027 A1 | 12/2010 | Lee et al. |
| 2010/0320459 A1 | 12/2010 | Umeda et al. |
| 2010/0323517 A1 | 12/2010 | Baker-O'Neal et al. |
| 2010/0327422 A1 | 12/2010 | Lee et al. |
| 2011/0011737 A1 | 1/2011 | Wu et al. |
| 2011/0048524 A1 | 3/2011 | Nam et al. |
| 2011/0124192 A1 | 5/2011 | Ganguli et al. |
| 2011/0151677 A1 | 6/2011 | Wang et al. |
| 2011/0163449 A1 | 7/2011 | Kelly et al. |
| 2011/0165781 A1 | 7/2011 | Liang et al. |
| 2011/0174363 A1 | 7/2011 | Munteanu |
| 2011/0198736 A1 | 8/2011 | Shero et al. |
| 2011/0204518 A1 | 8/2011 | Arunachalam |
| 2011/0233778 A1 | 9/2011 | Lee et al. |
| 2011/0237019 A1 | 9/2011 | Horng et al. |
| 2011/0240464 A1 | 10/2011 | Rasheed et al. |
| 2011/0263091 A1 | 10/2011 | Yamazaki |
| 2011/0303147 A1 | 12/2011 | Tachibana et al. |
| 2011/0305836 A1 | 12/2011 | Murata et al. |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0100678 A1 | 4/2012 | Sako et al. |
| 2012/0112224 A1 | 5/2012 | Le Bellac et al. |
| 2012/0138146 A1 | 6/2012 | Furuhata et al. |
| 2012/0142192 A1 | 6/2012 | Li et al. |
| 2012/0142198 A1 | 6/2012 | Wang et al. |
| 2012/0153483 A1 | 6/2012 | Akolkar et al. |
| 2012/0175822 A1 | 7/2012 | Inamiya et al. |
| 2012/0252207 A1 | 10/2012 | Lei et al. |
| 2012/0252210 A1 | 10/2012 | Tohnoe |
| 2012/0258602 A1 | 10/2012 | Subramani et al. |
| 2012/0285492 A1 | 11/2012 | Lee et al. |
| 2012/0304485 A1 | 12/2012 | Hayashi et al. |
| 2012/0309190 A1 | 12/2012 | Kelly et al. |
| 2013/0068391 A1 | 3/2013 | Mazzocco et al. |
| 2013/0069174 A1 | 3/2013 | Chuang et al. |
| 2013/0194350 A1 | 8/2013 | Watanabe et al. |
| 2013/0233170 A1 | 9/2013 | Spiegelman et al. |
| 2013/0241037 A1 | 9/2013 | Jeong et al. |
| 2013/0256125 A1 | 10/2013 | Young et al. |
| 2013/0277760 A1 | 10/2013 | Lu et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0003892 A1 | 1/2014 | Yamamoto et al. |
| 2014/0023320 A1 | 1/2014 | Lee et al. |
| 2014/0034632 A1 | 2/2014 | Pan et al. |
| 2014/0045300 A1 | 2/2014 | Chen et al. |
| 2014/0051264 A1 | 2/2014 | Mallick et al. |
| 2014/0076494 A1 | 3/2014 | Miyashita et al. |
| 2014/0102877 A1 | 4/2014 | Yamazaki |
| 2014/0134827 A1 | 5/2014 | Swaminathan et al. |
| 2014/0138802 A1 | 5/2014 | Starostine et al. |
| 2014/0144462 A1 | 5/2014 | Verhaverbeke et al. |
| 2014/0159135 A1 | 6/2014 | Fujimoto et al. |
| 2014/0183743 A1 | 7/2014 | Matsumoto et al. |
| 2014/0213070 A1 | 7/2014 | Hong et al. |
| 2014/0231384 A1 | 8/2014 | Underwood et al. |
| 2014/0234583 A1 | 8/2014 | Ryu et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0273335 A1 | 9/2014 | Abushama |
| 2014/0284821 A1 | 9/2014 | Hubbard |
| 2014/0319129 A1 | 10/2014 | Ahmad |
| 2014/0319462 A1 | 10/2014 | Huang et al. |
| 2014/0322921 A1 | 10/2014 | Ahmad et al. |
| 2015/0000870 A1 | 1/2015 | Hosotani et al. |
| 2015/0021672 A1 | 1/2015 | Chuang et al. |
| 2015/0024592 A1 | 1/2015 | Chandrashekar et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0093891 A1 | 4/2015 | Zope et al. |
| 2015/0099342 A1 | 4/2015 | Tsai et al. |
| 2015/0144999 A1 | 5/2015 | Ching et al. |
| 2015/0145002 A1 | 5/2015 | Lee et al. |
| 2015/0159272 A1 | 6/2015 | Yoon et al. |
| 2015/0179501 A1 | 6/2015 | Jhaveri et al. |
| 2015/0197455 A1 | 7/2015 | Pranov |
| 2015/0203961 A1 | 7/2015 | Ha et al. |
| 2015/0255581 A1 | 9/2015 | Lin et al. |
| 2015/0279635 A1 | 10/2015 | Subramani et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0348824 A1 | 12/2015 | Kuenle et al. |
| 2015/0357195 A1 | 12/2015 | Lam et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0053366 A1 | 2/2016 | Stowell et al. |
| 2016/0064209 A1 | 3/2016 | Lee et al. |

(56) References Cited

U.S. PATENT DOCUMENTS

| | | |
|---|---|---|
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0093726 A1 | 3/2016 | Ching et al. |
| 2016/0111272 A1 | 4/2016 | Girard et al. |
| 2016/0111337 A1 | 4/2016 | Hatcher et al. |
| 2016/0118260 A1 | 4/2016 | Mebarki et al. |
| 2016/0118391 A1 | 4/2016 | Zhao et al. |
| 2016/0126104 A1 | 5/2016 | Shaviv et al. |
| 2016/0163540 A1 | 6/2016 | Liao et al. |
| 2016/0181414 A1 | 6/2016 | Huang et al. |
| 2016/0186363 A1 | 6/2016 | Merzaghi et al. |
| 2016/0204027 A1 | 7/2016 | Lakshmanan et al. |
| 2016/0208414 A1 | 7/2016 | Odawara et al. |
| 2016/0260526 A1 | 9/2016 | Otto |
| 2016/0268127 A1 | 9/2016 | Yamazaki |
| 2016/0273758 A1 | 9/2016 | Fujimura |
| 2016/0274454 A1 | 9/2016 | Beasley et al. |
| 2016/0284882 A1 | 9/2016 | Jang |
| 2016/0308048 A1 | 10/2016 | Ching et al. |
| 2016/0314964 A1 | 10/2016 | Tang et al. |
| 2016/0329190 A1 | 11/2016 | Evans et al. |
| 2016/0329458 A1 | 11/2016 | Evans et al. |
| 2016/0334162 A1 | 11/2016 | Kim et al. |
| 2016/0336405 A1 | 11/2016 | Sun et al. |
| 2016/0336475 A1 | 11/2016 | Mackie et al. |
| 2016/0353522 A1 | 12/2016 | Rathi et al. |
| 2016/0355927 A1 | 12/2016 | Weaver et al. |
| 2016/0358809 A1 | 12/2016 | Brown et al. |
| 2016/0358815 A1 | 12/2016 | Yu et al. |
| 2016/0372319 A1 | 12/2016 | Zeng et al. |
| 2016/0377972 A1 | 12/2016 | Hofmann et al. |
| 2016/0379853 A1 | 12/2016 | Schaller et al. |
| 2016/0379854 A1 | 12/2016 | Vopat et al. |
| 2017/0005188 A1 | 1/2017 | Cheng et al. |
| 2017/0005204 A1 | 1/2017 | Hosoba et al. |
| 2017/0011932 A1 | 1/2017 | Pethe et al. |
| 2017/0053784 A1 | 2/2017 | Subramani et al. |
| 2017/0053946 A1 | 2/2017 | Matsuzaki et al. |
| 2017/0084487 A1 | 3/2017 | Chebiam et al. |
| 2017/0104062 A1 | 4/2017 | Bi et al. |
| 2017/0110616 A1 | 4/2017 | Dissanayake et al. |
| 2017/0117379 A1 | 4/2017 | Chen et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0200642 A1 | 7/2017 | Shaviv |
| 2017/0253968 A1 | 9/2017 | Yahata |
| 2017/0263702 A1 | 9/2017 | Chan et al. |
| 2017/0263773 A1 | 9/2017 | Yamazaki |
| 2017/0287842 A1 | 10/2017 | Fu et al. |
| 2017/0301767 A1 | 10/2017 | Niimi et al. |
| 2017/0314125 A1 | 11/2017 | Fenwick et al. |
| 2017/0317109 A1 | 11/2017 | Wang et al. |
| 2017/0358483 A1 | 12/2017 | Roy et al. |
| 2018/0003567 A1 | 1/2018 | Petry et al. |
| 2018/0019249 A1 | 1/2018 | Zhang et al. |
| 2018/0023192 A1 | 1/2018 | Chandra et al. |
| 2018/0033615 A1 | 2/2018 | Tjandra |
| 2018/0051368 A1 | 2/2018 | Liu et al. |
| 2018/0053725 A1 | 2/2018 | Edelstein et al. |
| 2018/0068890 A1 | 3/2018 | Zope et al. |
| 2018/0087418 A1 | 3/2018 | Cadigan et al. |
| 2018/0096847 A1 | 4/2018 | Thompson et al. |
| 2018/0096874 A1 | 4/2018 | Schaller et al. |
| 2018/0182856 A1 | 6/2018 | Lee |
| 2018/0209037 A1 | 7/2018 | Citla et al. |
| 2018/0240682 A1 | 8/2018 | Lai et al. |
| 2018/0258533 A1 | 9/2018 | Liang et al. |
| 2018/0261480 A1 | 9/2018 | Liang et al. |
| 2018/0286674 A1 | 10/2018 | Manna et al. |
| 2018/0308669 A1 | 10/2018 | Bokka et al. |
| 2018/0315626 A1 | 11/2018 | Franklin |
| 2018/0323093 A1 | 11/2018 | Zhang et al. |
| 2018/0337027 A1 | 11/2018 | L'Heureux et al. |
| 2018/0342384 A1 | 11/2018 | Wong et al. |
| 2018/0342396 A1 | 11/2018 | Wong et al. |
| 2018/0350563 A1 | 12/2018 | Manna et al. |
| 2018/0366328 A1 | 12/2018 | Ren et al. |
| 2019/0019708 A1 | 1/2019 | Weaver et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0170591 A1 | 6/2019 | Petry et al. |
| 2019/0198367 A1 | 6/2019 | Liang et al. |
| 2019/0198368 A1 | 6/2019 | Weaver et al. |
| 2019/0228982 A1 | 7/2019 | Chen et al. |
| 2019/0229004 A1 | 7/2019 | Schaller et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0259638 A1 | 8/2019 | Schaller et al. |
| 2019/0279879 A1 | 9/2019 | Singh et al. |
| 2019/0311896 A1 | 10/2019 | Balseanu et al. |
| 2019/0326138 A1 | 10/2019 | Forderhase et al. |
| 2019/0360100 A1 | 11/2019 | Nguyen et al. |
| 2019/0360633 A1 | 11/2019 | Schaller et al. |
| 2019/0368035 A1 | 12/2019 | Malik et al. |
| 2019/0371650 A1 | 12/2019 | Sun et al. |
| 2019/0375105 A1 | 12/2019 | Weaver et al. |
| 2020/0035509 A1 | 1/2020 | Khan et al. |
| 2020/0035513 A1 | 1/2020 | Khan et al. |
| 2020/0075392 A1 | 3/2020 | Brown et al. |
| 2020/0098574 A1 | 3/2020 | Wong et al. |
| 2021/0167235 A1 | 6/2021 | Li et al. |

FOREIGN PATENT DOCUMENTS

| | | |
|---|---|---|
| CN | 104047676 A | 9/2014 |
| CN | 104089491 A | 10/2014 |
| CN | 103035513 B | 10/2016 |
| EP | 0516344 A1 | 12/1992 |
| EP | 0670590 A2 | 9/1995 |
| EP | 1069213 A2 | 1/2001 |
| EP | 1107288 A2 | 6/2001 |
| EP | 0840365 A3 | 10/2003 |
| JP | S63-004616 A | 1/1988 |
| JP | 63067721 A | 3/1988 |
| JP | H1218018 A | 8/1989 |
| JP | H04355922 A | 12/1992 |
| JP | H0521347 A | 1/1993 |
| JP | H06283496 A | 10/1994 |
| JP | H07048489 B2 | 5/1995 |
| JP | H07158767 A | 6/1995 |
| JP | H08195493 A | 7/1996 |
| JP | H09048690 A | 2/1997 |
| JP | H9296267 A | 11/1997 |
| JP | H10214880 A | 8/1998 |
| JP | H10335657 A | 12/1998 |
| JP | H11209872 A | 8/1999 |
| JP | H11354515 A | 12/1999 |
| JP | 2000221799 A | 8/2000 |
| JP | 2000357699 A | 12/2000 |
| JP | 2001053066 A | 2/2001 |
| JP | 2001110729 A | 4/2001 |
| JP | 2001274161 A | 10/2001 |
| JP | 200351474 A | 2/2003 |
| JP | 2003166065 A | 6/2003 |
| JP | 2003188387 A | 7/2003 |
| JP | 2004127958 A | 4/2004 |
| JP | 200579528 A | 3/2005 |
| JP | 2005064269 A | 3/2005 |
| JP | 2005530343 A | 10/2005 |
| JP | 2005333015 A | 12/2005 |
| JP | 2006526125 A | 11/2006 |
| JP | 2007242791 A | 9/2007 |
| JP | 2008073611 A | 4/2008 |
| JP | 2008118118 A | 5/2008 |
| JP | 2008153635 A | 7/2008 |
| JP | 2009129927 A | 6/2009 |

(56) References Cited

FOREIGN PATENT DOCUMENTS

| | | |
|---|---|---|
| JP | 2009539231 A | 11/2009 |
| JP | 201080949 A | 4/2010 |
| JP | 2010168607 A | 8/2010 |
| JP | 2010205854 A | 9/2010 |
| JP | 201129394 A | 2/2011 |
| JP | 2011258943 A | 12/2011 |
| JP | 2012503883 A | 2/2012 |
| JP | 2012204656 A | 10/2012 |
| JP | 2013105777 A | 5/2013 |
| JP | 2013516788 A | 5/2013 |
| JP | 2013179244 A | 9/2013 |
| JP | 2014019912 A | 2/2014 |
| JP | 2014103351 A | 6/2014 |
| JP | 2015067884 A | 4/2015 |
| JP | 2015086459 A | 5/2015 |
| JP | 2015115394 A | 6/2015 |
| JP | 2015233157 A | 12/2015 |
| KR | 19980063671 A | 10/1998 |
| KR | 20010046843 A | 6/2001 |
| KR | 20030052162 A | 6/2003 |
| KR | 100422433 B1 | 7/2004 |
| KR | 10-20040068969 A | 8/2004 |
| KR | 20050121750 A | 12/2005 |
| KR | 100684910 B1 | 2/2007 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140104112 A | 8/2014 |
| KR | 101438291 B1 | 9/2014 |
| KR | 20140135744 A | 11/2014 |
| KR | 20150006587 A | 1/2015 |
| KR | 20150122432 A | 11/2015 |
| KR | 20160044004 A | 4/2016 |
| KR | 20160061437 A | 5/2016 |
| TW | 200529284 A | 9/2005 |
| TW | 200721316 A | 6/2007 |
| TW | 201507174 A | 2/2015 |
| TW | 201608672 A | 3/2016 |
| TW | 201708597 A | 3/2017 |
| WO | 200051938 A1 | 9/2000 |
| WO | 03023827 A1 | 3/2003 |
| WO | 2004102055 A1 | 11/2004 |
| WO | 2005057663 A2 | 6/2005 |
| WO | 2008047886 A1 | 4/2008 |
| WO | 2008089178 A2 | 7/2008 |
| WO | 2010115128 A3 | 1/2011 |
| WO | 2011002058 A1 | 1/2011 |
| WO | 2011103062 A2 | 8/2011 |
| WO | 2012133583 A1 | 10/2012 |
| WO | 2014115600 A1 | 7/2014 |
| WO | 2015195081 A1 | 12/2015 |
| WO | 2016018593 A1 | 2/2016 |
| WO | 2016065219 A1 | 4/2016 |
| WO | 2016111833 A1 | 7/2016 |
| WO | 2018187546 A1 | 10/2018 |

OTHER PUBLICATIONS

Office Action for Japanese Patent Application No. 2020-543976 dated Jul. 13, 2021.
Taiwan Office Action dated Jul. 28, 2021 for Application No. 107108016.
International Search Report and Written Opinion for International Application No. PCT/US2019/032609 dated Sep. 11, 2019.
Lin, Kevin L. et al.—"Nickel silicide for interconnects", 2015 IEEE International Interconnect Technology Conference and 2015 IEEE Materials for Advanced Metallization Conference (IITC/MAM), IEEE, (XP032808874), May 18, 2015, pp. 169-172.
EPO Extended European Search Report dated Aug. 9, 2019, for European Patent Application No. 19166775.7.
Japanese Office Action dated Mar. 17, 2020, for Japanese Patent Application No. 2019-073230.
Taiwan Office Action dated Mar. 31, 2020, for Taiwan Patent Application No. 108111883.
Korean Office Action dated Aug. 4, 2020, for Korean Patent Application No. 10-2019-0040236.
Japanese Office Action dated Nov. 10, 2020, for Japanese Patent Application No. 2019-073230.
T. Miyake et al., "Effects of atomic hydrogen on Cu reflow process", AIP Conferenec Proceedings 418, 419 (1998).
International Search Report and Written Opinion dated Aug. 24, 2017 for Application No. PCT/US2017/033862.
Taiwan Office Action for Application No. 106119184 dated Mar. 6, 2019.
Japanese Office Action for Application No. 2018-564195 dated Nov. 19, 2019.
PCT Notification of Transmittal of the International Search Report and the Written Opinion of the International Searching Authority for International Application No. PCT/US2019/061995; dated Mar. 9, 2020; 13 total pages.
International Search Report PCT/2020/046396 dated Nov. 26, 2020 consists of 12 pages.
International Search Report and Written Opinion for PCT/US2021/014991 dated May 17, 2021.
Korean Office Action dated Aug. 26, 2021, for Korean Patent Application No. 10-2020-4016526.
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
International Search Report and Written Opinion for PCT/US2018/043160 dated Jan. 31, 2019.
International Search Report and Written Opinion dated Jan. 31, 2019 for Application No. PCT/US2018/042760.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/015339 dated May 15, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.

(56) References Cited

OTHER PUBLICATIONS

Taiwan Office Action dated Jul. 3, 2019 for Application No. 107136151.
International Search Report and Written Opinion for International Application No. PCT/US2019/029602 dated Aug. 14, 2019.
Taiwan Office Action dated Jun. 11, 2019 for Application No. 107138905.
Office Action for Japanese Application No. 2018-546484 dated Oct. 8, 2019.
International Search Report and Written Opinion for International Application No. PCT/US2019/040195 dated Oct. 25, 2019.
Taiwan Office Action dated Nov. 19, 2019 for Application No. 108103415.
Office Action for Japanese Application No. 2018-517285 dated Oct. 23, 2019.
Office Action for Taiwan Patent Application No. 108111501 dated Nov. 14, 2019.
International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Faiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
Taiwan Office Action dated Oct. 12, 2020 for Application No. 108140559.
Office Action for Japanese Application No. 2019-548976 dated Oct. 20, 2020.
European International Search Report issued to 18764622.9 dated Nov. 20, 2020.
Office Action for Korean Application No. 10-2019-7029776 dated Jan. 18, 2021.
Taiwan Office Action dated May 4, 2020 for Application No. 107121254.
Japanese Office Action dated Feb. 16, 2021 for Application No. 2019-564964.
Extended European International Search Report issued to 18831823.2 dated Mar. 19, 2021.
Office Action for Korean Application No. 10-2020-7004396 dated Apr. 5, 2021.
Japanese Office Action dated Apr. 20, 2021 for Application No. JP 2020-508603.
Korean Office Action issued to Application No. 10-2019-7038099 dated May 1, 2021.
Office Action for Japanese Patent Application No. 2019-548976 dated May 25, 2021.
Office Action for Japanese Patent Application No. 2020-500629 dated Jun. 8, 2021.
Extended European Search Report for EP Application No. 18876650.5 dated Jul. 19, 2021.
Extended European Search Report for EP Application No. 18806169.1 dated Jul. 19, 2021.

METHODS OF FORMING AMORPHOUS CARBON HARD MASK LAYERS AND HARD MASK LAYERS FORMED THEREFROM

CROSS-REFERENCE TO RELATED APPLICATIONS

This application is a divisional of co-pending patent application Ser. No. 16/396,167, filed Apr. 26, 2019, which claims priority to U.S. Provisional Application Ser. No. 62/668,558 filed on May 8, 2018, each which is herein incorporated by reference in its entirety.

BACKGROUND

Field

Embodiments of the present disclosure generally relate to methods used in semiconductor device manufacturing, and more particularly, to methods used to form an amorphous carbon hard mask layer on a substrate in an electronic device fabrication process.

Description of the Related Art

Carbon hard masks, formed of amorphous carbon layers, are well known and are commonly used in processes of record (POR) in semiconductor manufacturing. Unfortunately, processing issues caused by inherent properties of amorphous carbon layers deposited using conventional methods are expected to increase as a result of ongoing scaling of DRAM device structures to less than ~10 nm, which will require higher aspect ratio etching of device features such as deep contact holes or trenches. One such processing issue is related to poor uniformity in the local stress of the amorphous carbon layer across the substrate, herein designated as the degree of variation in local stress, or "local stress nonuniformity". Non-uniform (e.g., undulating in value) local film stress values across a substrate can cause one, or both, of undesirable localized pattern distortions and pattern overlay error during the lithography processes that are performed after the deposition of the amorphous carbon layer. Pattern distortion and overlay errors may require time consuming and thus costly rework of, or even failure of, the device.

Accordingly, what is needed in the art are methods of reducing local stress nonuniformity in amorphous carbon layers.

SUMMARY

Embodiments of the present disclosure generally relate to methods of reducing the local stress nonuniformity of an amorphous carbon layer which has been deposited on a substrate using a physical vapor deposition (PVD) process. In particular, embodiments described herein provide methods of annealing a substrate, having an amorphous carbon layer deposited thereon, to desirably reduce variation in local stresses thereacross.

In one embodiment, a method of processing a substrate includes positioning a substrate, having an amorphous carbon layer deposited thereon, in a first processing volume, flowing an anneal gas into the first processing volume, heating the substrate to an anneal temperature of not more than about 450° C., and maintaining the substrate at the anneal temperature for about 30 seconds or more. Herein, the amorphous carbon layer was deposited on the substrate using a method which included positioning the substrate on a substrate support disposed in a second processing volume, flowing a processing gas into the second processing volume, applying pulsed DC power to a carbon target disposed in the second processing volume, forming a plasma of the processing gas, and depositing the amorphous carbon layer on the substrate. Herein, the first processing volume is a processing volume of a first processing chamber and the second processing volume is a processing volume of a second processing chamber. In some embodiments, the first and second processing chambers are part of a multi-chamber processing system and are coupled by a transfer chamber disposed therebetween.

In another embodiment, a method of processing a substrate includes depositing an amorphous carbon layer and annealing the substrate. Depositing the amorphous carbon layer includes positioning the substrate on a substrate support disposed in a first processing volume, flowing a processing gas into the first processing volume, wherein the processing gas comprises an inert gas and a reactive gas comprising hydrogen, nitrogen, or a combination thereof, maintaining the substrate at a deposition temperature of about 200° C. or less, applying pulsed DC power to a carbon target disposed in the first processing volume, forming a plasma of the processing gas, and depositing the amorphous carbon layer on the substrate. Annealing the substrate includes positioning the substrate, having the amorphous carbon layer deposited thereon, in a second processing volume, heating the substrate to an anneal temperature of between about 50° C. and about 450° C., and maintaining the substrate at the anneal temperature for about 30 seconds or more. Herein, the first processing volume is a processing volume of a first processing chamber and the second processing volume is a processing volume a second processing chamber. In some embodiments, the first and second processing chambers are part of a multi-chamber processing system and are coupled by a transfer chamber disposed therebetween.

In another embodiment, a carbon hard mask includes an amorphous carbon layer deposited on a substrate, the amorphous carbon layer thickness between about 1 kÅ and about 40 kÅ, a density of between about 2.0 g/cm$^3$ and about 2.4 g/cm$^3$, a hardness between about 15 GPa and about 20 GPa, an RMS surface roughness of less than about 1.5 nm, an absorption coefficient (optical k) value of less than about 0.3 at a wavelength of about 633 nm, a global compressive film stress of less than about 2000 MPa, and a Young's modulus of between about 100 GPa and about 300 GPa. Herein, a local shape curvature (LSC) nonuniformity across the substrate, having the amorphous carbon layer deposited thereon, is less than about 2 nm/mm$^2$.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the present disclosure generally relate to methods of reducing the local stress nonuniformity of an amorphous carbon layer which has been deposited on a substrate using a physical vapor deposition (PVD) process.

Generally, amorphous carbon layers deposited using physical vapor deposition (PVD) processes desirably have a higher density and a greater resistance to an etch precursor used to etch the film underlying the amorphous carbon layer, as compared to carbon films deposited using chemical vapor deposition (CVD) processes. Higher etch resistance to the etch precursor used to etch the film underlying the amorphous carbon layer results in PVD deposited amorphous carbon layers being the preferred carbon hardmask material for etch applications where processes for etching very high aspect ratio openings benefit from hard mask materials high having higher etch selectivity compared to the underlying material layer, for example 3D NAND applications. Unfortunately, amorphous carbon layers deposited using PVD processes may exhibit poor uniformity of local stresses across the surface of the substrate. Non-uniform stress distributions that vary with spatial position across the substrate, such as material layer film stresses that undulate or change in value across the substrate, can elastically locally distort the substrate in the corresponding regions thereof. Conventional lithography systems will often use a linear overlay correction method to correct for elastic distortion caused by a substantially uniform film stress distribution, e.g., global bowing of the substrate. However, these conventional linear overlay correction methods are often insufficient to remove overlay errors caused by out-of-plane undulations of the substrate due to high local stress uniformity of material layers thereon. Therefore, embodiments herein provide methods of annealing a substrate, having an amorphous carbon layer deposited thereon, to desirably reduce variations in local stresses, and thus local stress nonuniformity, in the amorphous carbon layer thereacross.

Typically, the deposition of the amorphous carbon layer and the subsequent anneal process are performed using a multi-chamber processing system (i.e., a cluster tool) which allows for one, or both, of sequential processing operations without exposing the substrate to atmospheric conditions and reduced overall substrate processing time by eliminating the substrate loading and unloading operations that would be used if the anneal chamber was a standalone chamber or part of a separate multi-chamber processing system. In some embodiments, the deposition of the amorphous carbon layer is performed in a processing chamber and the subsequent anneal process is performed in a degas chamber coupled to the processing chamber.

Figure 1:
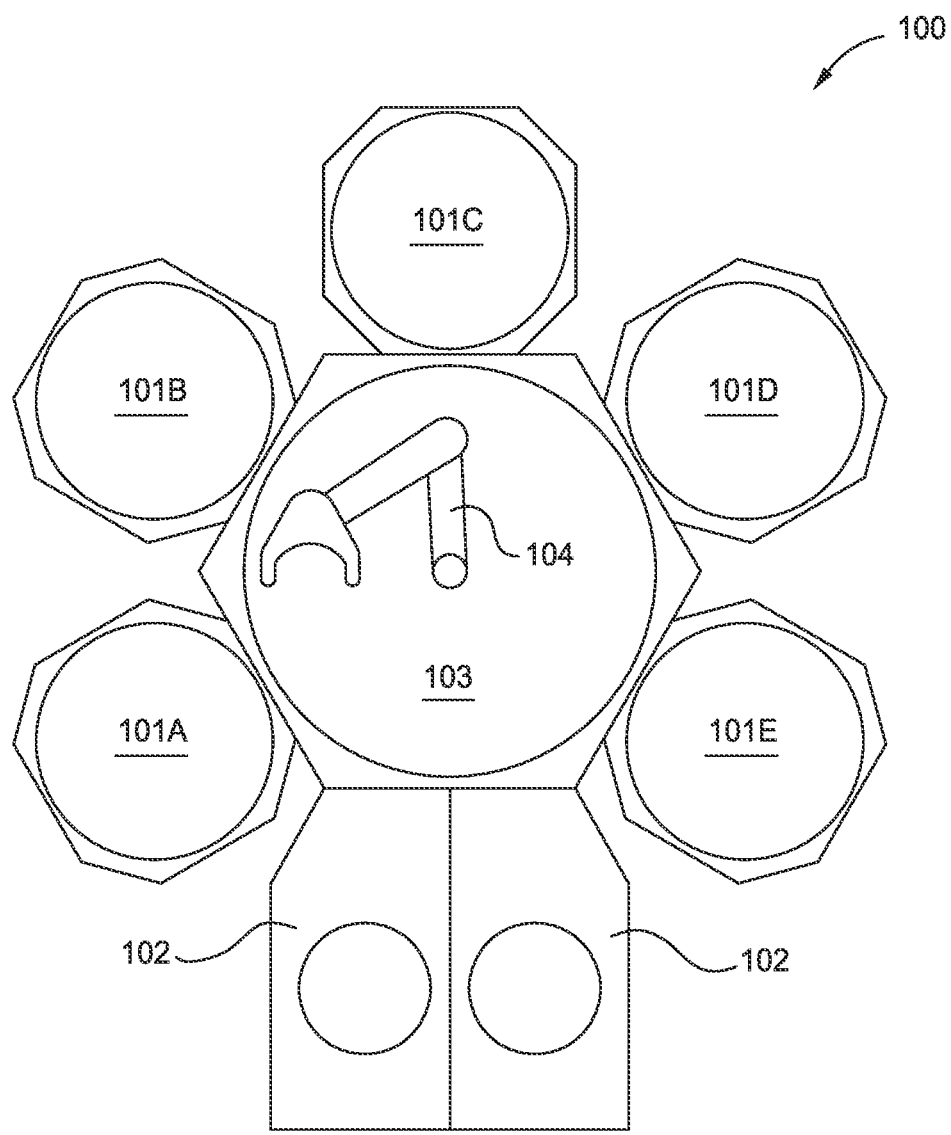
FIG. 1 is a schematic plan view of a multi-chamber processing system used to practice the methods set forth herein, according to one embodiment.

FIG. 1 is a schematic plan view of a multi-chamber processing system used to practice the methods set forth herein, according to one embodiment. Herein, the multi-chamber processing system 100 includes a plurality of processing chambers 101A-E, one or more load lock chambers 102, and a transfer chamber 103 (shown with the cover removed) having a robot handler 104 disposed therein. Typically, at least one of the processing chambers 101A-E is a deposition chamber, such as the exemplary high power impulse magnetron sputtering (HiPIMS) deposition chamber 200 further described in FIG. 2A, and at least one of the processing chambers 101A-E is an anneal chamber, such as the anneal chamber 400 further described in FIG. 4. Other exemplary multi-chamber processing systems that can be used to practice the methods set forth herein include ENDURA® and CHARGER® multi-chamber processing platforms available from Applied Materials, Inc. of Santa Clara, Calif. as well as suitable deposition chambers from other manufacturers.

Herein, the plurality of processing chambers 101A-E are coupled to the transfer chamber 103 which allows for transferring of a substrate between processing chambers, and thus sequential processing of the substrate using more than one processing chamber, without exposing the substrate to atmospheric conditions.

Figure 2:
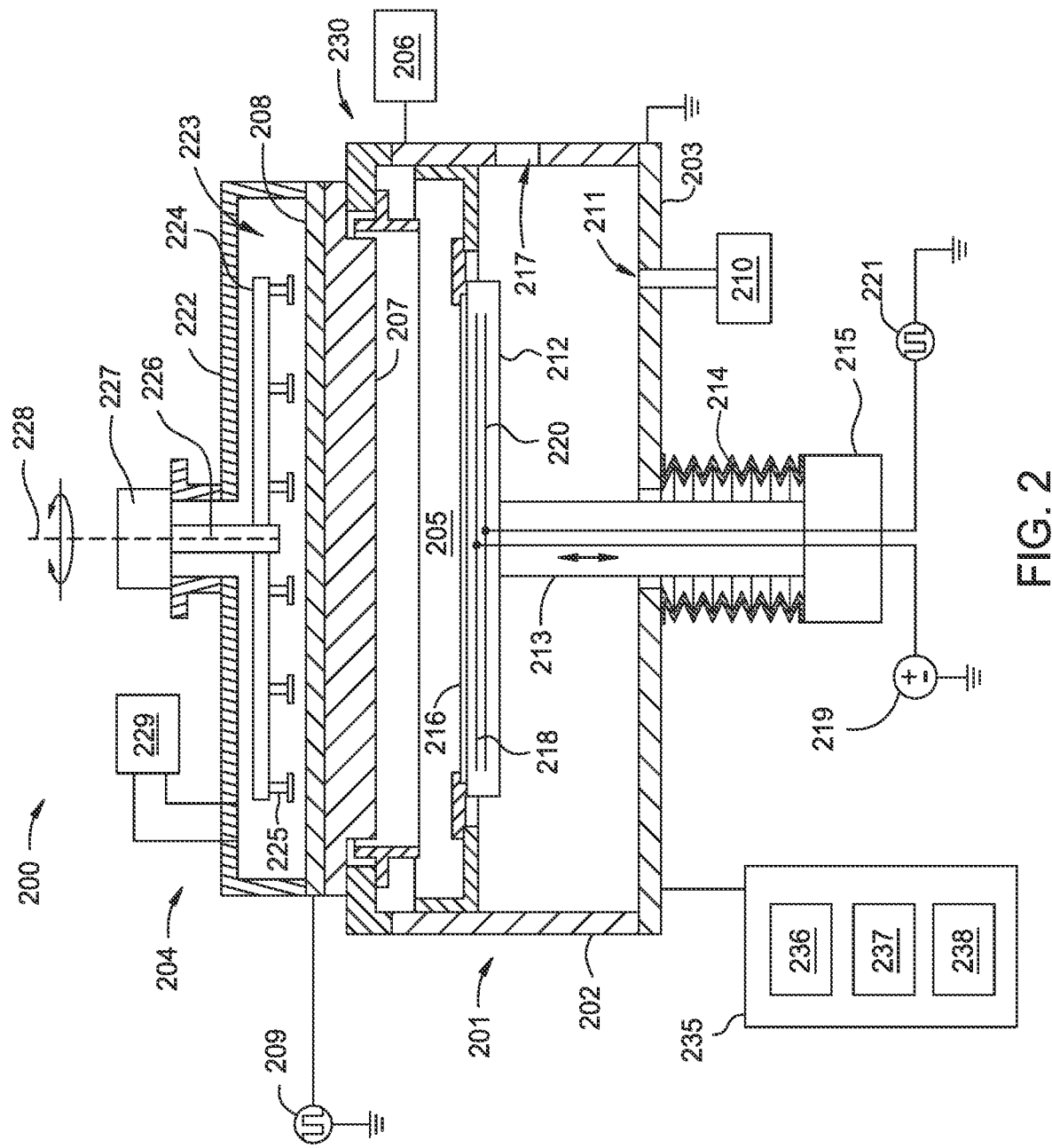
FIG. 2 a schematic cross-sectional view of an exemplary processing chamber, used to practice the methods set forth herein, according to one embodiment.

FIG. 2 a schematic cross-sectional view of an exemplary processing chamber, herein a high power impulse magnetron sputtering (HiPIMS) processing chamber, used to practice the methods set forth herein. The deposition chamber 200 includes a chamber body 201 featuring one or more sidewalls 202, a chamber base 203, and a lid assembly 204, which together define a processing volume 205. The processing volume 205 is fluidly coupled to a gas source 206 which provides processing gases thereinto. A target 207, bonded to a metallic backing plate 208, is disposed in the processing volume 205 and is connected to the lid assembly 204. The backing plate 208 is coupled to a pulsed DC power supply, herein a first power supply 209, which when a pulse therefrom is imposed on the target 207, ignites a plasma composed of the processing gases in the processing volume 205 by capacitive coupling therewith. The processing volume 205 is fluidly coupled to a vacuum source, such as one or more dedicated vacuum pumps 210, through a vacuum outlet 211, to maintain the processing volume 205 at sub-atmospheric pressure and evacuate processing, and other gases, therefrom.

The deposition chamber 200 further includes a substrate support 212 disposed in the processing volume 205 which is coupled to a support shaft 213 extending through the chamber base 203. A bellows 214 circumscribes the support shaft 213 and is coupled to the underside of the chamber base 203 of the deposition chamber 200 and a base plate on the substrate support 212 connected to an actuator 215 to provide a flexible seal therebetween and to maintain the vacuum integrity of the processing volume 205. The actuator 215 raises and lowers the support shaft 213, and thus the substrate support 212 disposed thereon, to facilitate processing of a substrate 216 and locating thereof to transfer thereof to and from the processing volume 205. Typically, when the substrate support 212 is in a raised or substrate processing position, the substrate 216 is spaced apart from a surface of the target 207 by between about 20 mm and about 250 mm, such as between about 40 mm to 60 mm.

Herein, the substrate 216 is transferred into and out of the processing volume 205 through an opening 217 formed through the sidewall 202, which is conventionally sealed with a door or valve (not shown) during substrate processing. Typically, a lift pin system (not shown), having a plurality of lift pins (not shown) disposed through the substrate support 212, is configured to lift the substrate 216 off of the substrate support 212 and enable access to the substrate 216 by a robot handler (not shown) to facilitate transferring of the substrate 216 to and from a surface of the substrate support 212 and in or out of the opening 217.

During processing, the substrate 216 is secured to the surface of the substrate support 212 by means of electrostatic attraction between the substrate 216 and substrate support 212 created as a result of powering a chucking electrode 218 embedded in a dielectric material of the substrate support 212. The chucking electrode 218 is electrically coupled to a second power supply 219. Herein, the second power supply 219 is a static DC power supply which provides between about −5000 V and about 5000 V. The substrate support 212 herein further includes a bias electrode 220, disposed in the dielectric material thereof, which is electrically isolated from the chucking electrode 218 by the dielectric material of the substrate support 212 disposed therebetween. The bias electrode 220 is electrically coupled to a third power supply 221 which is herein an RF power supply that operates in a pulsing or continuous wave (CW) mode. In pulsing mode, the RF bias power provided to the bias electrode typically has a pulse width (pulse duration) of between about 10 μs and about 200 μs, such as between about 10 μs and about 100 μs, such as between about 10 μs and about 50 μs, for example between about 10 μs and about 25 μs. Herein, the pulsed RF bias power has a time on duty cycle between about 10% and about 90%, such as between about 30% and about 70%. Typically, the average RF bias power provided to the bias electrode in pulsing mode or in CW mode is between about 20 W and about 1000 W for a substrate support configured for a 300 mm diameter substrate, such as between about 20 W and about 500 W, for example about 150 W. Appropriate scaling may be used for substrate supports for different sized substrates where the RF bias power per $cm^2$ at a surface of the substrate 216 is between about 0.028 $W/cm^2$ and about 1.415 $W/cm^2$, such as between about 0.028 $W/cm^2$ and about 0.71 $W/cm^2$, for example about 0.21 $W/cm^2$.

In some embodiments, the substrate support 212 is further coupled to a cooling base (not shown) which is used to regulate the temperature of the substrate support 212, and the substrate 216 disposed on the surface thereof, during the deposition process. Typically, the cooling base includes one or more fluid conduits disposed therein which are in fluid communication with a coolant source (not shown) such as a refrigerant source or a temperature controlled fluid source.

The lid assembly 204 herein includes a magnetron housing 222 and the target 207 bonded to the metallic backing plate 208 which define a housing volume 223, a magnetron assembly 224 disposed in the housing volume 223, and a ground shield assembly 230 which electrically insulates the target 207, and the metallic backing plate 208 bonded thereto, from the sidewalls 202 of the chamber body 201. The magnetron assembly 224 herein includes a plurality of high strength magnets 225, such as neodymium iron boride magnets, arranged to provide a magnetic field which extends through the target 207 and into the processing volume 205. magnetic field traps electrons along magnetic field lines to increase the plasma ion density by enabling additional electron-gas atom collisions. The negative bias on the target accelerates sputtering gas ions, such as ions of Argon, in the processing plasma toward the target where they strike the target to knock carbon atoms from the target 207 that can then deposit on the surface of the substrate 216 to form an amorphous carbon layer described herein. In one embodiment, a strength of the magnetic field in the plasma is between about 200 Gauss and about 1000 Gauss, such as between about 200 Gauss and about 500 Gauss, or between about 500 Gauss and about 1000 Gauss, or more than about 200 Gauss, more than about 500 Gauss, or more than about 800 Gauss.

In some embodiments, the lid assembly 204 further includes a motor 227 coupled to the magnetron assembly 224 by a rotatable shaft 226 which rotates to move the magnetron assembly 224 about an axis 228 during the deposition process. Rotating the magnetron assembly 224 during the deposition process desirably moves high ion density regions across the target surface to desirably allow more uniform erosion of carbon material from the face of the target 207 which reduces the nonuniformity of the deposited amorphous carbon layer and desirably extends the useful life of the target 207. Typically, the magnetron assembly 224 is moved about the axis 228 at between about 10 rpm and about 200 rpm, such as between about 40 rpm and about 150 rpm. In other embodiments, the magnetron assembly 224 does not move during the deposition process. In some embodiments, a cooling fluid having a relatively high resistivity is delivered to the housing volume 223 from a cooling fluid source 229 in fluid communication therewith to cool the magnetron assembly 224 and adjacent backing plate 208 and the target 207 bonded thereto.

Herein, the deposition chamber 200 includes a controller 235 coupled thereto. The controller 235 herein includes a central processing unit (CPU) 236, a memory 237, and support circuits 238. The controller 235 is used to control the process sequence, regulate the gas flows from the gas source 206 into the deposition chamber 200, bias the substrate 216 disposed on the substrate support 212, heat/cool and or maintain the substrate support 212 and/or the substrate disposed thereon at a desired temperature, and control ion bombardment of the target 207 by controlling the high voltage pulsed DC power provided to the target 207 and the magnetron housing 222 by the first power supply 209 and by controlling the speed of the magnetron assembly 224 about the axis 228. Herein, the CPU 236 is a general purpose computer processor configured for use in an industrial setting for controlling processing chamber and sub-processors related thereto. The memory 237 herein includes random access memory, read only memory, floppy or hard disk drive, or other suitable forms of digital storage, local or remote. Herein, the support circuits 238 are coupled to the CPU 236 and comprise cache, clock circuits, input/output subsystems, power supplies, and the like, and combinations thereof. In some embodiments, the controller 235 further includes one or more computer readable media (not shown).

Computer readable media herein includes any device, located either locally or remotely from the controller 235, which is capable of storing information that is retrievable by a computing device. Examples of computer readable media useable with embodiments of the present disclosure include solid state memory, floppy disks, internal or external hard drives, and optical memory (CDs, DVDs, BR-D, etc.). In one embodiment, the computer readable media comprises the memory 237. Further, any connection is properly termed a computer-readable medium. For example, when instructions are transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Software routines, when executed by the CPU 236, transform the CPU into a specific purpose computer, herein the controller 235, which controls the operation of the deposition chamber 200, such that the processes are performed in accordance with embodiments of the disclosure. In some embodiments, the software routines are stored and/or executed by a second controller (not shown) which is located remotely from the deposition chamber 200. In other embodiments, the processes described herein, or portions thereof, are performed by one or more application specific integrated circuits (ASIC) or other types of hardware implementations. In some other embodiments, the processes described herein are performed by a combination of software routines, ASIC(s), and/or other types of hardware implementations. In some embodiments, the controller 235 is further used to control the operation of the multi-chamber processing system 100 described in FIG. 1, including the processing chambers coupled thereto.

Figure 3:
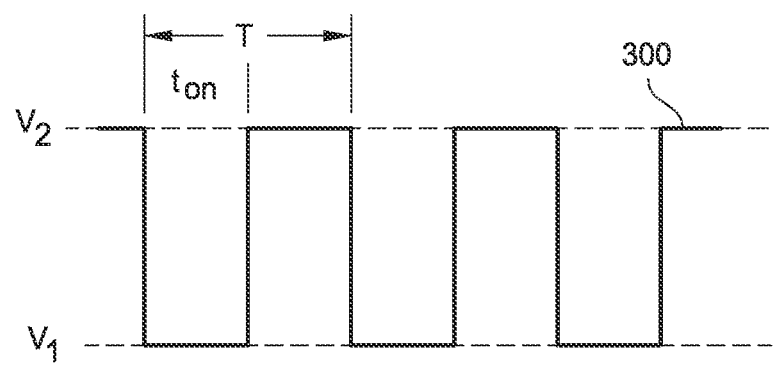
FIG. 3 illustrates a cyclic pulsed DC power applied to a target of the processing chamber described in FIG. 2, according to one embodiment.

FIG. 3 illustrates the time to amplitude relationship of a cyclic pulsed DC power waveform 300, such as the high voltage pulsed DC power waveform provided to the target 207 by the first power supply 209 shown in FIG. 2. Herein, the cyclic pulsed DC power waveform 300 cycles from a first voltage $V_1$ of between about −100 V and about −1400 V to a second voltage $V_2$ of about 0 V. In some embodiments, the second voltage is a positive voltage of more than about 0 V. The cyclic pulsed DC power 300 has a pulse duration, herein pulse active time $t_{on}$, between about 10 μs and about 40 μs, or less than about 200 μs, such as less than about 100 μs, such as less than about 50 μs, for example less than about 35 μs and a cycle period T. Typically, the cycle period T is less than about 400 μs, such as less than about 300 μs, for example less than about 200 μs or a pulse repetition frequency is more than about 2500 Hz, such as more than about 3300 Hz, for example more than about 5000 Hz. As shown, the cyclic pulsed DC power 300 has a square wave shape, in other embodiments the cyclic pulsed DC power 300 has a non-square wave shape. Herein, an average DC power provided to the target during the pulse active time $t_{on}$ is between about 1 kW and about 11 kW for a target disposed in a processing chamber configured to process 300 mm diameter substrates. Appropriate scaling may be used for targets disposed in processing chambers configured to process different sized substrates where the average DC power during the pulse active time $t_{on}$ per $cm^2$ of a surface of the target is between about 1 $W/cm^2$ and about 20 $W/cm^2$, such as between about 1.4 $W/cm^2$ and about 16 $W/cm^2$.

Figure 4:
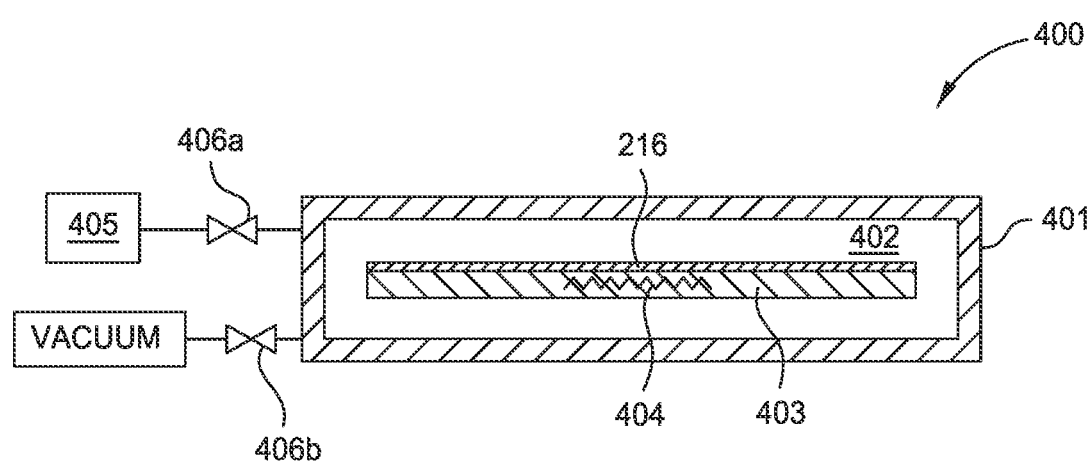
FIG. 4 is a schematic cross-sectional view of an exemplary anneal chamber used to practice the methods set forth herein, according to one embodiment.

FIG. 4 is a schematic cross-sectional view of an exemplary anneal chamber used to practice the methods set forth herein, according to one embodiment. The anneal chamber 400 features a chamber body 401 defining a processing volume 402 and a substrate support 403 disposed in the processing volume. Herein, the anneal chamber is a single substrate processing chamber configured to heat a substrate 216 disposed on the substrate support 403 to a desired temperature using a heat source, such as a resistive heater 404, embedded in the substrate support 403. In some embodiments, the substrate support 403 is a hot plate. In some embodiments (not shown), the heat source is a radiant heat source, such as a plurality of lamps positioned above, below, or both above and below the substrate 216 to radiate heat theretowards. In some other embodiments, the anneal chamber is a batch processing chamber configured to heat a plurality of substrates in a single anneal process sequence.

Herein, the processing volume 402 is fluidly coupled to a gas source 405 and to a vacuum source, such as one or more dedicated vacuum pumps or to a common fab exhaust. In some embodiments, the gas source 405 includes one or more pumps (not shown) that pressurize one or more anneal gases delivered thereto. During substrate processing the processing volume 402 is desirably maintained at a desired pressure through operation of valves 406a and 406b fluidly coupled to the gas source 405 and the vacuum source respectively. In some embodiments, the anneal chamber 400 and the deposition chamber 200 are part of a multi-chamber processing system (i.e., cluster tool), such as the multi-chamber processing system 100 described in FIG. 1. In other embodiments (not shown), the anneal chamber 400 is a standalone chamber or one of a plurality of connected chambers that is coupled to the deposition chamber 200 described in FIG. 2.

Figure 5:
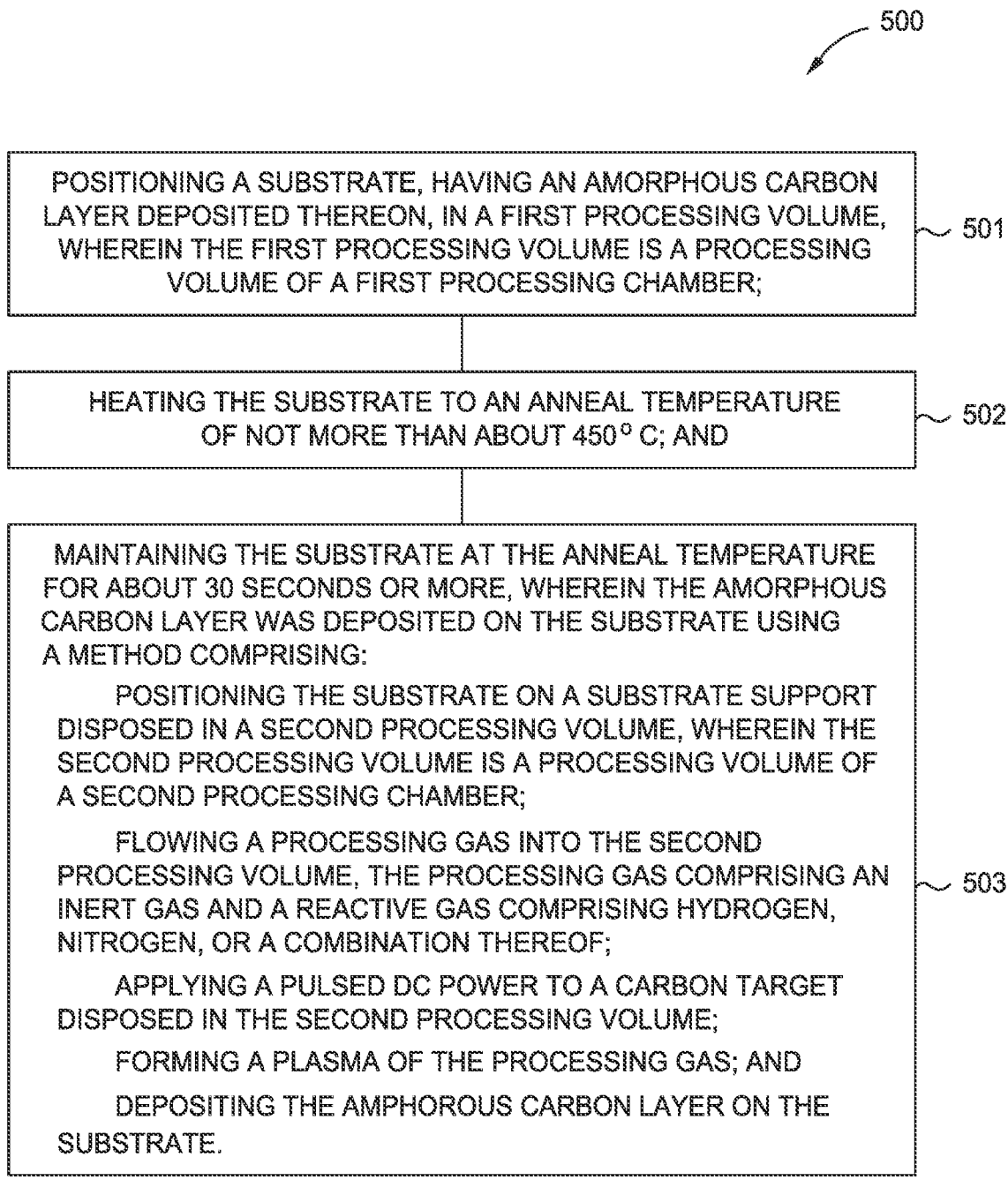
FIG. 5 is a flow diagram of a method of processing a substrate, according to one embodiment.
Figure 6A:
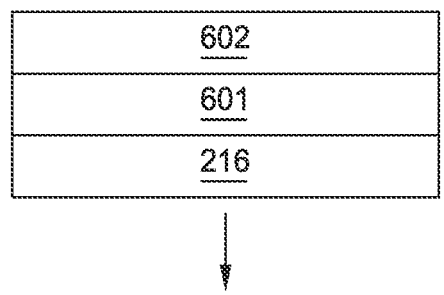
FIGS. 6A-6C illustrate the results of a method of patterning a substrate using the substrate processing method set forth in FIG. 5.
Figure 6B:
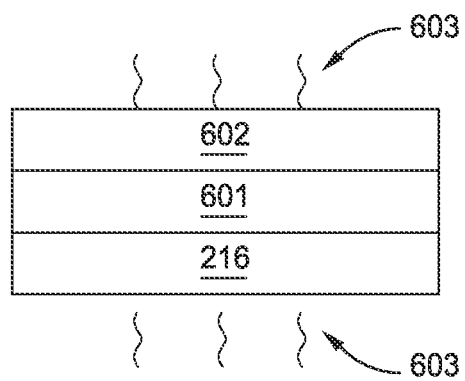
Figure 6C:
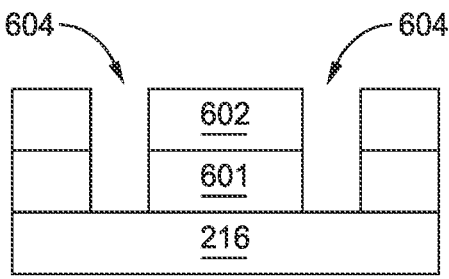

FIG. 5 is a flow diagram of a method of processing a substrate, according to one embodiment. FIGS. 6A-6C illustrate a method of patterning a substrate using the substrate processing method set forth in FIG. 5.

At activity 501 the method 500 includes positioning a substrate, such as the substrate 216 shown in FIG. 6A having an amorphous carbon layer 602 deposited thereon, in a first processing volume. Herein, the first processing volume is a processing volume of a first processing chamber, such as the anneal chamber 400 described in FIG. 4. Typically, one or both of the substrate 216 or one or more material surfaces 601 thereof are formed of a material comprising crystalline silicon, silicon oxide, silicon oxynitride, silicon nitride, strained silicon, silicon germanium, tungsten, titanium nitride, doped or undoped polysilicon, carbon doped silicon oxides, silicon nitrides, doped silicon, germanium, gallium arsenide, glass, sapphire, low k dielectric materials, or combinations thereof. In some embodiments, the material surface 601 of the substrate 216 comprises a low-k dielectric material, such as a low-k carbon containing dielectric layer, a porous silicon oxycarbide low-k, an ultra-low-k dielectric layer, or a combination thereof. In some embodiments, the amorphous carbon layer 602 has a thickness between about 800 Å and about 16 kÅ, for example less than about 2 kÅ, such as less than about 1 kÅ, or more than about 4 kÅ, such as more than about 5 kÅ, or more than about 6 kÅ. In other embodiments, the amorphous carbon layer 602 has a thickness of up to about 40 kÅ, such as between about 1 kÅ and about 40 kÅ, or between about 10 kÅ and about 40 kÅ.

At activity 502 the method 500 includes heating the substrate to an anneal temperature of not more than about 450° C., such as between about 50° C. and about 400° C., between about 50° C. and about 250° C., between about 75° C. and about 225° C., for example between about 100° C. and about 200° C.

At activity 503 the method 500 includes maintaining the substrate at the anneal temperature for about 30 seconds or more, such as between about 30 seconds and about 3 hours, between about 30 seconds and about 60 minutes, between about 30 seconds and about 10 minutes, between about 30 seconds and about 30 minutes, between about 30 seconds and about 5 minutes, or less than about 3 hours, such as less than about 60 minutes, less than about 30 minutes, less than about 10 minutes, or less than about 5 minutes.

In some embodiments, the method 500 further includes flowing an anneal gas into the first processing volume and maintaining the first processing volume at a desired pressure through the duration of activities 502 and 503, or at least through the duration of activity 503. Examples of anneal gases used herein include Ar, He, Kr, forming gas (a mixture of $H_2$ and $N_2$), $N_2$, $O_2$, CO, $CO_2$, and combinations thereof. Typically, the first processing volume is maintained at desired pressure, herein an anneal pressure, of more than about 0.1 bar, such as between about 0.1 bar and about 10 bar, such as between about 0.1 bar and about 5 bar, for example between about 0.5 bar and about 2 bar. In some embodiments, the first processing chamber is a high pressure anneal chamber capable of pressurizing the processing volume to pressures more than about 10 bar, for example up to about 45 bar and the first processing volume is maintained at a pressure of between about 1 bar and about 45 bar, such as between about 1 bar and about 20 bar.

Herein, the amorphous carbon layer was deposited on the substrate using a method which included positioning the substrate on a substrate support disposed in a second processing volume, flowing a processing gas into the second processing volume, applying pulsed DC power to a carbon target disposed in the second processing volume, forming a plasma of the processing gas, and depositing the amorphous carbon layer on the substrate. In some embodiments, the method 500 includes depositing the amorphous carbon layer 602 on the substrate 216 or a material surface 601 thereof.

Herein, the second processing volume is a processing volume of a second processing chamber, such as the deposition chamber 200 described in FIG. 2. Typically, the processing gas used to sputter the target to provide the carbon to form the amorphous carbon layer includes an inert gas, such as Ar, He, Ne, Kr, Xe, or a combination thereof. In some embodiments, the processing gas further includes a reactive gas. In some embodiments, depositing the amorphous carbon layer further includes biasing the substrate. Biasing the substrate desirably improves roughness and optical K (transparency), but increases film stress. Adding a hydrogen source gas, such as hydrogen or a hydrogenated carbon gas, or a nitrogen source gas, such as $N_2$ or $NH_3$, to an inert gas desirable reduces the roughness and desirably reduces film stress of the as deposited amorphous carbon layer when compared to methods that use only an inert gas, such as Kr. Further, the combination of a hydrogen source gas and an inert gas, such as $H_2$ and Kr, improves optical K properties of the resulting film when compared to methods that use only an inert gas or use a hydrogen source gas and an inert gas. The combination of biasing and adding a hydrogen source gas or a nitrogen source gas during the deposition process results in an amorphous carbon layer with higher density, higher etch resistance, lower film roughness, and lower stress when compared to conventional PVD methods.

Typically, the reactive gas comprises hydrogen, nitrogen, or a combination thereof. In some embodiments, the reactive gas comprises a hydrogen source gas such as $H_2$, hydrogenated carbon gas, or a combination thereof, where hydrogenated carbon gases include $CH_4$, $C_2H_2$, $C_3H_8$, $C_4H_{10}$, $C_2H_4$, $C_3H_6$, $C_4H_8$, and $C_5H_{10}$, or a combination thereof. In other embodiments, the reactive gas comprises a nitrogen source gas, such as $N_2$, $NH_3$, or a combination thereof. Typically, the processing gas comprises between about 5% and about 95% hydrogen source gas, nitrogen source gas, or a combination thereof, such as between about 5% and about 50%, such as between about 5% and about 40%, for example between about 20% and about 40% or more than about 20%. In one embodiment, the processing gas comprises Kr and $N_2$ or Kr and $H_2$. Typically, a processing pressure in the second processing volume is maintained between about 1.3 microbar and about 13 microbar, such as less than about 13 microbar, or such as between about 1.3 microbar and about 66 microbar, during the deposition process.

In some embodiments, the pulsed DC power applied to the carbon target disposed in the second processing volume cycles from a first voltage between about −100 V and about −1400 V to a second voltage $V_2$ of about 0 V or more. Typically, an average pulse duration, herein a pulse active time, of the pulsed DC power is between about 10 μs and about 200 μs. In some embodiments, the average DC power per $cm^2$ of the sputterable surface of the target is between about 1 $W/cm^2$ and about 20 $W/cm^2$, such as between about 1.4 $W/cm^2$ and about 16 $W/cm^2$ for each pulse cycle. In embodiments herein, the target comprises a carbon containing material, such as graphite, amorphous carbon, sp2 type carbon materials, or combinations thereof, which is bonded to a metallic backing plate with an adhesive or by other conventional means.

In some embodiments, forming the plasma in the second processing volume includes providing a bias power to a bias electrode disposed in the dielectric material of the substrate support. In one embodiment, the bias power is a pulsed RF bias power having an average pulse duration of between about 10 μs and about 200 μs, such as between about 10 μs and about 100 μs, such as between about 10 μs and about 50 μs, for example between about 10 μs and about 25 μs and an on-time duty cycle between about 10% and about 90%, such as between about 30% and about 70%. In one embodiment, an average RF bias power per $cm^2$ of a surface of the substrate 216 is between about 0.028 $W/cm^2$ and about 1.415 $W/cm^2$, such as between about 0.028 $W/cm^2$ and about 0.71 $W/cm^2$, for example about 0.21 $W/cm^2$ for each pulse cycle. In other embodiments, the RF bias power is provided in a continuous wave (CW).

In some embodiments, depositing the amorphous carbon layer 602 includes maintaining the substrate 216 at a temperature of 200° C. or less, such as between about −50° C. and about 200° C., between about −50° C. and about 100° C., or between about −50° C. and about 50° C.

In some embodiments, the method 500 further includes depositing a patterning layer (not shown) on the amorphous carbon layer 602. Herein, the patterning layer is deposited in a different deposition chamber, such as a CVD chamber of PVD chamber (i.e., a third processing chamber), than the deposition chamber used to deposit the amorphous carbon layer. Typically, the patterning layer comprises silicon oxide, silicon nitride, amorphous silicon, or a combination thereof. In some embodiments, the deposition chamber used to deposit the amorphous carbon layer, the anneal chamber, and the deposition chamber used to deposit the patterning layer are part of the same multi-chamber processing system (i.e., cluster tool), such as the multi-chamber processing system 100 described in FIG. 1. In some embodiments, the method 500 further includes forming a plurality of openings (not shown) through the patterning layer (not shown) using conventional lithography and etch processes. The plurality of openings in the patterning layer are then extended through the amorphous carbon layer 602 to form a pattern (i.e., the plurality of openings 604 in the amorphous carbon layer 602) and are further extended through the underlying material surface 601 as shown in FIG. 6C.

Figure 7A:
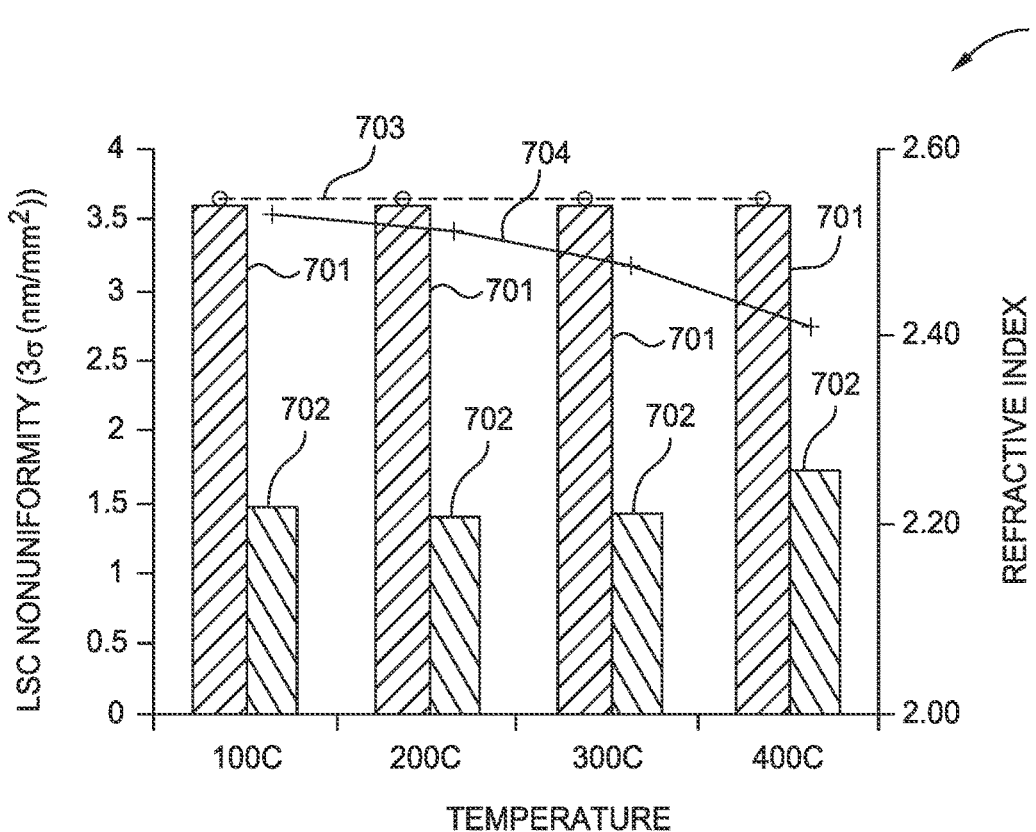
FIGS. 7A and 7B compare the local stress nonuniformity of substrates, having amorphous carbon layers deposited thereon, before and after annealing the substrates using the methods described herein.
Figure 7B:
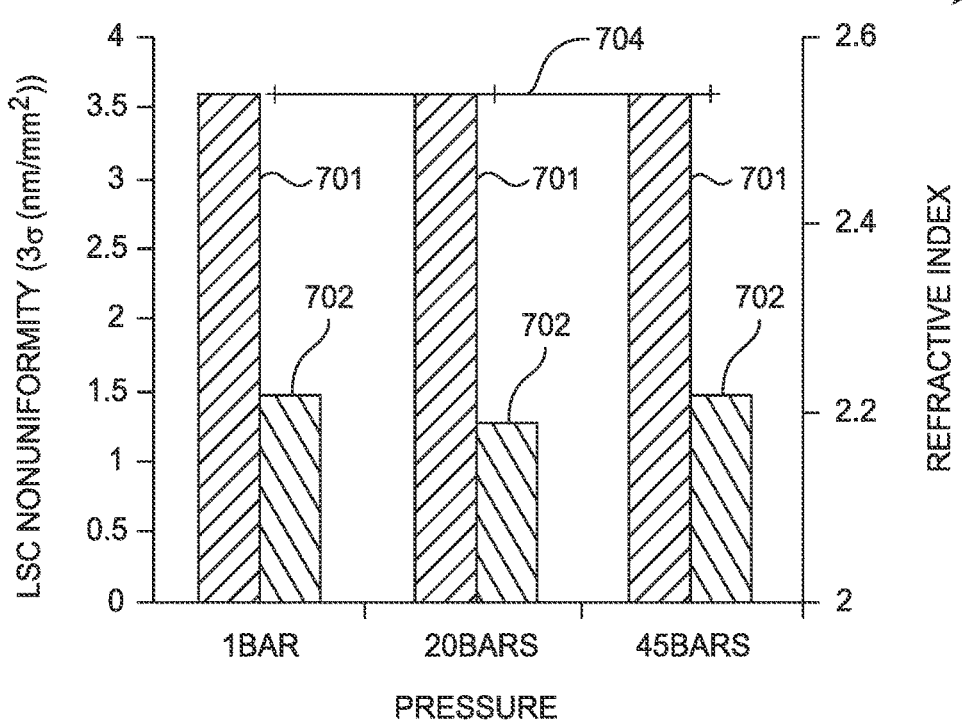

FIGS. 7A and 7B compare the local shape curvature (LSC) uniformity of 300 mm diameter substrates, each having an amorphous carbon layers deposited thereon, before and after annealing the substrates using the methods described herein. The LSC uniformity metric is a shape-curvature-change metric conventionally used to predict process induced local stresses on a substrate, such as the local stress nonuniformities described herein. The amorphous carbon layers in FIGS. 7A and 7B were deposited to a thickness of about 1000 Å using a HiPIMS process, such as the HiPIMS process described herein.

In FIG. 7A each of four substrates were maintained at a desired anneal temperature in an $N_2$ environment at 45 bars for 10 minutes. Pre-anneal LSC nonuniformity 701 and post-anneal LSC nonuniformity 702 values were determined for each of the four substrates processed at anneal temperatures of 100° C., 200° C., 300° C., and 400° C. respectively and are shown in the chart 700. The pre-anneal refractive index 703 and the post-anneal refractive index 704 of the amorphous carbon layers on each of the four respective substrates are also shown on chart 700. Generally, an amorphous carbon layer having a higher refractive index will also have a higher film density when compared to an amorphous carbon layer having a lower refractive index. Higher film densities in amorphous carbon hard masks desirably result in decreased deformation of high aspect ratio features formed in the underlying substrate or material layer when compared to high aspect ratio features formed using lower density amorphous carbon hard masks. As shown, annealing the substrates, and thus the amorphous carbon layers deposited thereon, resulted in a more than 2× reduction in LSC nonuniformity for each of the substrates processed at anneal temperatures of 100° C., 200° C., 300° C., and 400° C. respectively. Further, the refractive index of the amorphous carbon layers processed at temperatures of 200° C. and below did not significantly change (e.g., <5% change) from pre-anneal 703 to post anneal 704 indicating that anneal temperatures of about 200° C. or below can be used to reduce local stress nonuniformity without significantly reducing film density. Table 1 further shows global substrate bow measurements pre and post anneal for each of the four substrates processed at the anneal temperatures of 100° C., 200° C., 300° C., and 400° C. respectively.

TABLE 1

| Anneal Temperature (° C.) | Pre-Anneal Substrate Bow (μm) | Post-Anneal Substrate Bow (μm) |
|---|---|---|
| 100 | 115.59 | 115.80 |
| 200 | 115.20 | 115.59 |
| 300 | 115.61 | 119.59 |
| 400 | 116.4 | 127.31 |

In FIG. 7B each of three substrates were maintained at a desired anneal pressure and an anneal temperature of 100° C. in an $N_2$ environment for 10 minutes. Pre-anneal LSC nonuniformity 701 and post-anneal LSC nonuniformity 702 values were determined for each of three substrates processed at anneal pressures of 1 bar, 20 bars, and 45 bars respectively and are shown in chart 705. The post-anneal refractive index 704 of the amorphous carbon layers on each of the three respective substrates is also shown on chart 705. The post-anneal refractive index 704 of the amorphous carbon layers on each of the respective substrates varied less than 1 from the pre-anneal refractive index (not shown). As shown, annealing the substrates at an anneal temperature of 100° C. results a more than 2× reduction in LSC nonuniformity for each of the substrates processed at 1 bar, 20 bars, and 45 bars and less than 1% change in refractive index.

FIGS. 7A and 7B collectively show that the methods provided herein can be used to improve the LSC nonuniformity of a substrate, and thus the local stress nonuniformity of an amorphous carbon layer, without undesirably reducing the density of the amorphous carbon layer or undesirably increasing the global bow of the substrate.

In other embodiments, a carbon hard mask is provided. The carbon hard mask comprises an amorphous carbon layer disposed on a substrate, wherein the amorphous carbon layer has a thickness between 1 kÅ and about 40 kÅ, such as between about 1 kÅ and about 16 kÅ or between about 10 kÅ and about 40 kÅ, a density of between about 2.0 $g/cm^3$ and about 2.4 $g/cm^3$, a hardness between about 15 GPa and about 20 GPa, an RMS surface roughness of less than about 1.5 nm, an absorption coefficient (optical k) value of less than about 0.3 at a wavelength of about 633 nm, a global compressive film stress of less than about 2000 MPa, a Young's modulus of between about 100 GPa and about 300 GPa, a substantially columnar free morphology, and a local stress nonuniformity across a substrate of less than about 2%. In some embodiments, the amorphous carbon layer has a hardness of more than about 15 GPa, such as more than about 16 GPa, for example more than about 17 GPa. In some embodiments, the amorphous carbon layer has an RMS surface roughness less than about 1 nm, less than about 0.5 nm, for example less than about 0.25 nm. In some embodiments, the amorphous carbon layer has an absorption coefficient (optical k) value of less than about 0.25 at a wavelength of about 633 nm, less than about 0.20, for example less than about 0.17, or about equal to 0.15. In some embodiments, the amorphous carbon layer has a global compressive film stress between about 1000 MPa and about 2000 MPa, such as between about 1000 MPA and about 1500 MPA, such as less than about 1500 MPa, or less than about 1200 MPa. Herein, the amorphous carbon layer has a Young's modulus of between about 150 GPa and about 250 GPa, or more than about 150 GPa, or less than about 250 GPa. In some embodiments, the amorphous carbon layer has a refractive index of not less than about 2.4, such as not less than about 2.5. In some embodiments, the amorphous carbon layer has a plurality of openings formed therethrough, wherein each of the plurality of openings have an aspect ratio (height to width) of more than about 2:1, such as more than about 3:1, more than about 4:1, more than about 5:1, more than about 6:1, more than about 7:1, more than about 8:1, more than about 9:1, for example more than about 10:1.

The methods described above result in reduced variations in local stresses, and thus local stress nonuniformity, in an amorphous carbon layer deposited on a substrate. Reduced local stress nonuniformity of the amorphous carbon layer will desirably reduce or eliminate local shape curvature (LSC) nonuniformities that undesirably cause localized pattern distortions and pattern overlay error in subsequent lithography processes. Further, the annealing processes described herein may be performed in the same multi-chamber substrate processing system as used to deposit the amorphous carbon layer without exposing the substrate to atmospheric conditions. Annealing the substrate in the same multi-chamber substrate processing system used to deposit the amorphous carbon layer desirably reduces substrate processing time by eliminating redundant loading and unloading operations that would be used if the anneal chamber was a standalone chamber or part of a separate multi-chamber processing system.

While the foregoing is directed to embodiments of the present disclosure, other and further embodiments of the disclosure may be devised without departing from the basic scope thereof, and the scope thereof is determined by the claims that follow.

The invention claimed is:

1. A carbon hard mask, comprising:
an amorphous carbon layer deposited on a substrate, wherein
a local shape curvature (LSC) nonuniformity across the substrate is less than 2 nm/mm$^2$, and
the amorphous carbon layer has a thickness between 1 kÅ and 40 kÅ.

2. The carbon hard mask of claim 1, wherein the amorphous carbon layer has a density of between 2.0 g/cm$^3$ and 2.4 g/cm$^3$.

3. The carbon hard mask of claim 1, wherein the amorphous carbon layer has a hardness between 15 GPa and 20 GPa.

4. The carbon hard mask of claim 1, wherein the amorphous carbon layer has an RMS surface roughness of less than 1.5 nm.

5. The carbon hard mask of claim 1, wherein the amorphous carbon layer has an absorption coefficient (optical k) value of less than 0.3.

6. The carbon hard mask of claim 1, wherein the amorphous carbon layer has a global compressive film stress of less than 2000 MPa.

7. The carbon hard mask of claim 1, wherein the amorphous carbon layer has a Young's modulus of between 100 GPa and 300 GPa.

8. A structure, comprising:
a material layer formed on a substrate; and
a hard mask formed on the material layer, wherein
the hard mask has higher etch selectivity compared to the material layer in an etch process to form openings in the material layer, and
a local shape curvature (LSC) nonuniformity across the substrate is less than 2 nm/mm$^2$.

9. The structure of claim 8, wherein the hard mask comprises amorphous carbon.

10. The structure of claim 8, wherein the material layer comprises crystalline silicon, silicon oxide, silicon oxynitride, silicon nitride, strained silicon, silicon germanium, tungsten, titanium nitride, doped or undoped polysilicon, carbon doped silicon oxides, silicon nitrides, doped silicon, germanium, gallium arsenide, glass, sapphire, low k dielectric materials, or combinations thereof.

11. The structure of claim 8, wherein the material layer comprises a low-k carbon containing dielectric layer, a porous silicon oxycarbide low-k, an ultra-low-k dielectric layer, or a combination thereof.

12. The structure of claim 8, wherein the hard mask has a thickness between 1 kÅ and 40 kÅ.

13. The structure of claim 8, wherein the hard mask has a density of between 2.0 g/cm$^3$ and 2.4 g/cm$^3$.

14. The structure of claim 8, wherein the hard mask has a hardness between 15 GPa and 20 GPa.

15. The structure of claim 8, wherein the hard mask has an RMS surface roughness of less than 1.5 nm.

16. The structure of claim 8, wherein the hard mask has an absorption coefficient (optical k) value of less than 0.3.

17. The structure of claim 8, wherein the hard mask has a global compressive film stress of less than 2000 MPa.

18. The structure of claim 8, wherein the hard mask has a Young's modulus of between 100 GPa and 300 GPa.

* * * * *